US012635251B2

(12) United States Patent
Shin et al.

(10) Patent No.: US 12,635,251 B2
(45) Date of Patent: May 19, 2026

(54) DISPLAY DEVICE

(71) Applicant: Samsung Display Co., LTD., Yongin-si (KR)

(72) Inventors: Dong Hee Shin, Yongin-si (KR); Sun Kwun Son, Yongin-si (KR); No Kyung Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 345 days.

(21) Appl. No.: 18/464,302

(22) Filed: Sep. 11, 2023

(65) Prior Publication Data

US 2024/0088165 A1      Mar. 14, 2024

(30) Foreign Application Priority Data

Sep. 13, 2022    (KR) ........................ 10-2022-0115195

(51) Int. Cl.
*H10D 86/60*      (2025.01)
*H01L 25/16*      (2023.01)
*H10D 86/40*      (2025.01)
*H10H 20/857*      (2025.01)

(52) U.S. Cl.
CPC ........... *H10D 86/60* (2025.01); *H01L 25/167* (2013.01); *H10D 86/441* (2025.01); *H10H 20/857* (2025.01)

(58) Field of Classification Search
None
See application file for complete search history.

(56) References Cited

U.S. PATENT DOCUMENTS

| | | | |
|---|---|---|---|
| 9,082,362 B2 | 7/2015 | Bae et al. | |
| 10,916,177 B2 | 2/2021 | Kim et al. | |
| 11,715,427 B2 | 8/2023 | Min et al. | |
| 11,848,335 B2 | 12/2023 | Oh et al. | |
| 2015/0053953 A1 | 2/2015 | Ebisuno et al. | |
| 2018/0218684 A1* | 8/2018 | Choi .................... | G09G 3/3258 |
| 2021/0049971 A1 | 2/2021 | Xiao et al. | |
| 2022/0068225 A1* | 3/2022 | Min ...................... | H10K 59/353 |
| 2022/0392923 A1* | 12/2022 | Oh .......................... | H01L 21/67 |
| 2025/0342801 A1* | 11/2025 | Wang ....................... | G09G 3/32 |

FOREIGN PATENT DOCUMENTS

| | | |
|---|---|---|
| KR | 10-1643588 | 7/2016 |
| KR | 10-1778650 | 9/2017 |
| KR | 10-2020-0082164 | 7/2020 |
| KR | 10-2021-0059075 | 5/2021 |
| KR | 10-2022-0030884 | 3/2022 |

* cited by examiner

*Primary Examiner* — Michelle Mandala
(74) *Attorney, Agent, or Firm* — Womble Bond Dickinson (US) LLP

(57)      ABSTRACT
A display device includes first and second pixels including first to third sub-pixels. Each of the first to third sub-pixels includes a first area disposed at a side of a pixel circuit, a second area disposed on another side of the pixel circuit, light emitting elements electrically connected to the pixel circuit, and an electrode electrically connecting the light emitting elements and the pixel circuit. The electrode of the first sub-pixel of the first pixel includes a first extension electrically connected to the pixel circuit in the first area and overlapping the second area in plan view, and the electrode of the first sub-pixel of the second pixel includes a second extension electrically connected to the pixel circuit in the second area and overlapping the first area in plan view.

20 Claims, 13 Drawing Sheets

PXL_ODD: SPX1_O, SPX2_O, SPX3_O
PXL_EVEN: SPX1_E, SPX2_E, SPX3_E
PXC: Cst_O, T1_O, T2_O, T3_O, Cst_E, T1_E, T2_E, T3_E

PL1: PL1_H, PL1_V
PL2: PL2_H, PL2_V

PXL_ODD: SPX1_O, SPX2_O, SPX3_O
PXL_EVEN: SPX1_E, SPX2_E, SPX3_E

FIG. 12

DISPLAY DEVICE

CROSS-REFERENCE TO RELATED APPLICATION(S)

This application claims priority to and benefits of Korean Patent Application No. 10-2022-0115195 under 35 U.S.C. § 119, filed on Sep. 13, 2022 in the Korean Intellectual Property Office, the entire contents of which are incorporated herein by reference.

BACKGROUND

1. Technical Field

The disclosure relates to a display device.

2. Description of the Related Art

Recently, as interest in an information display is increasing, research and development for a display device are continuously being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object to be solved by the disclosure is to provide a display device capable of reducing a load of a data line and minimizing a capacitance deviation of sub-pixels.

Objects of the disclosure are not limited to the above-described objects, and other objects will be clearly understood by those skilled in the art from the following description.

According to embodiments of the disclosure, a display device may include a first pixel and a second pixel, each of the first pixel and the second pixel including a first sub-pixel, a second sub-pixel, and a third sub-pixel; a first data line electrically connected to the first sub-pixel of the first pixel; a second data line electrically connected to the first sub-pixel of the second pixel, and a first connection line electrically connecting the first data line and the second data line. Each of the first sub-pixel, the second sub-pixel, and the third sub-pixel may include a first area disposed at a side of a pixel circuit; a second area disposed on another side of the pixel circuit; light emitting elements electrically connected to the pixel circuit; and an electrode electrically connecting the light emitting elements and the pixel circuit. The electrode of the first sub-pixel of the first pixel may include a first extension electrically connected to the pixel circuit in the first area and overlapping the second area in plan view, and the electrode of the first sub-pixel of the second pixel may include a second extension electrically connected to the pixel circuit in the second area and overlapping the first area in plan view.

The first pixel and the second pixel may be adjacent to each other in a same pixel row.

The first sub-pixel, the second sub-pixel, and the third sub-pixel may be sequentially disposed in a first direction.

The first data line and the second data line may be disposed in the first direction and may extend in a second direction.

The first data line may be disposed between the first sub-pixel and the second sub-pixel of the first pixel, and the second data line may be disposed between the first sub-pixel and the second sub-pixel of the second pixel.

The electrode of the first sub-pixel of the first pixel and the electrode of the first sub-pixel of the second pixel may have a same shape.

The electrode of the first sub-pixel of the first pixel and the electrode of the first sub-pixel of the second pixel may have a same area.

The first sub-pixel may emit light in a first color, the second sub-pixel may emit light in a second color, and the third sub-pixel may emit light in a third color.

The light emitting elements may include a first semiconductor layer; a second semiconductor layer disposed on the first semiconductor layer; and an active layer disposed between the first semiconductor layer and the second semiconductor layer.

The display device may further include a third data line electrically connected to the second sub-pixel of the first pixel; a fourth data line electrically connected to the second sub-pixel of the second pixel; and a second connection line electrically connecting the third data line and the fourth data line.

The display device may further include a fifth data line electrically connected to the third sub-pixel of the first pixel; a sixth data line electrically connected to the third sub-pixel of the second pixel; and a third connection line electrically connecting the fifth data line and the sixth data line.

According to embodiments of the disclosure, a display device may include a first pixel and a second pixel, each of the first pixel and the second pixel including a sub-pixel emitting light in a same color; a first data line electrically connected to the sub-pixel of the first pixel; a second data line electrically connected to the sub-pixel of the second pixel; and a connection line electrically connecting the first data line and the second data line. The sub-pixels may include a first area disposed at a side of a pixel circuit; a second area disposed on another side of the pixel circuit; light emitting elements electrically connected to the pixel circuit; and an electrode electrically connecting the pixel circuit and the light emitting elements. The electrode of the sub-pixel of the first pixel may include a first extension electrically connected to the pixel circuit in the first area and overlapping the second area in plan view, and the electrode of the sub-pixel of the second pixel may include a second extension electrically connected to the pixel circuit in the second area and overlapping the first area in plan view.

The first pixel and the second pixel may be adjacent to each other in a first direction in a same pixel row.

The first data line and the second data line may be disposed in the first direction and may extend in a second direction.

The electrode of the sub-pixel of the first pixel and the electrode of the sub-pixel of the second pixel may have a same shape.

The electrode of the sub-pixel of the first pixel and the electrode of the sub-pixel of the second pixel may have a same area.

The light emitting elements may include a first semiconductor layer; a second semiconductor layer disposed on the first semiconductor layer; and an active layer disposed between the first semiconductor layer and the second semiconductor layer.

The display device may further include alignment electrodes spaced apart from each other, and the light emitting elements may be disposed between the alignment electrodes.

The display device may further include a bridge electrode, the bridge electrode and the alignment electrodes being disposed on a same layer, and the electrode of the sub-pixels may be electrically connected to the pixel circuit through the bridge electrode.

The display device may further include a color conversion layer disposed on the light emitting elements; and a color filter layer disposed on the color conversion layer.

According to embodiments of the disclosure, since two sub-pixels share a data line, the number of channels of a driver and the entire load according to the number of channels may be reduced compared to a case in which the two sub-pixels are connected to two data lines.

Even though electrodes of the two sub-pixels are electrically connected to the pixel circuit in different areas, since the electrodes of the two sub-pixels may be formed at the same position or similar positions by including the extension extending to a remaining area, a capacitance deviation of the two sub-pixels may be minimized.

An effect according to embodiments is not limited by the contents illustrated above, and more various effects are included in the specification.

BRIEF DESCRIPTION OF THE DRAWINGS

The above and other features of the disclosure will become more apparent by describing in further detail embodiments thereof with reference to the accompanying drawings, in which:

FIG. 12 is a schematic perspective view illustrating a light emitting element according to an embodiment.

DETAILED DESCRIPTION OF THE EMBODIMENTS

Figure 1:
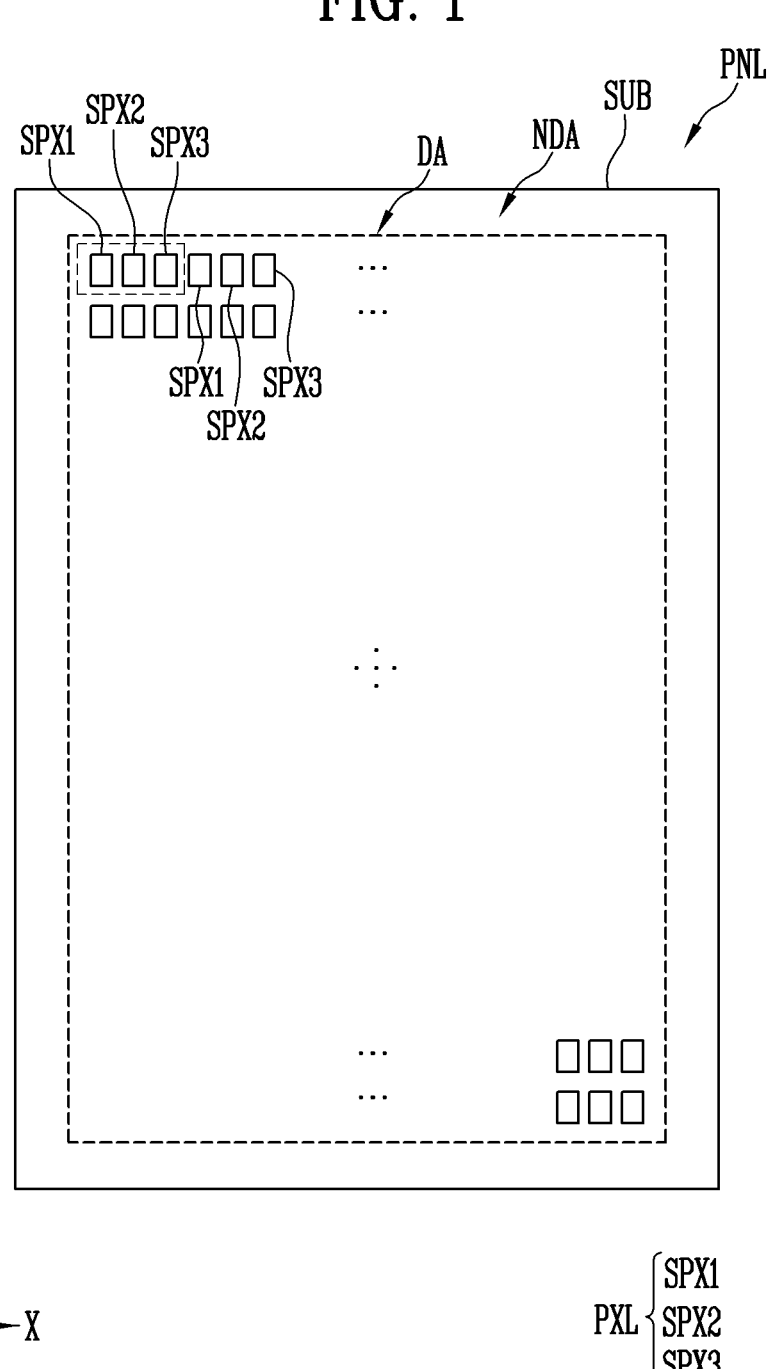
FIG. 1 is a schematic plan view illustrating a display device according to an embodiment.

The disclosure may be modified in various manners and have various forms.

Therefore, embodiments will be illustrated in the drawings and will be described in detail in the specification. However, it should be understood that the disclosure is not intended to be limited to the disclosed embodiments, and the disclosure includes all modifications, equivalents, and substitutions within the spirit and scope of the disclosure.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

Terms of "first", "second", and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component.

It should be understood that the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

A case where a portion of a layer, a layer, an area, a plate, or the like is referred to as being "on" another portion, it includes not only a case where the portion is "directly on" another portion, but also a case where there is further another portion or portions between the portion and another portion. In the specification, when a portion of a layer, a film, an area, a plate, or the like is formed on another portion, a forming direction is not limited to an upper direction but includes forming the portion on a side surface or in a lower direction. On the contrary, when a portion of a layer, a layer, an area, a plate, or the like is formed "under" another portion, this includes not only a case where the portion is "directly beneath" another portion but also a case where there is further another portion or portions between the portion and another portion.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The advantages and features of the disclosure and a method of achieving them will become apparent with reference to the embodiments described in detail together with the accompanying drawings. However, the disclosure is not limited to the embodiments disclosed below, and may be implemented in various different forms.

In the following description, a case where a portion is connected to another portion includes a case where they are electrically connected to each other with another element or elements interposed therebetween as well as a case in which they are directly connected to each other. In an embodiment of the disclosure, a term "connection" between two configurations may mean that both of an electrical connection and a physical connection are inclusively used.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device according to an embodiment of the disclosure is described with reference to drawings related to embodiments of the disclosure.

FIG. 1 is a schematic plan view illustrating a display device according to an embodiment. FIG. 1 shows a display panel PNL provided in the display device.

In FIG. 1, a structure of the display panel PNL is briefly shown based on a display area DA. However, according to an embodiment, at least one driving circuit unit (for example, at least one of a scan driver and a data driver), lines, and/or pads, which are/is not shown, may be further disposed on the display panel PNL.

Referring to FIG. 1, the display panel PNL may include a substrate SUB and a pixel PXL disposed on the substrate SUB.

The substrate SUB may form a base member of the display panel PNL, and may be a rigid or flexible substrate or film. For example, the substrate SUB may be a rigid substrate formed of glass or tempered glass, a flexible substrate (or thin film) of a plastic or metal material, or at least one layer or a layer of insulating layer. A material and/or a physical property of the substrate SUB are/is not particularly limited.

The display panel PNL and the substrate SUB for forming the same may include the display area DA for displaying an image and a non-display area NDA except for the display area DA.

The pixel PXL may be disposed in the display area DA. Various lines, pads, and/or built-in circuits connected to the pixel PXL of the display area NDA may be disposed in the non-display area NDA.

The pixel PXL may include sub-pixels SPX1, SPX2, and SPX3, and for example, the pixel PXL may include a first sub-pixel SPX1, a second sub-pixel SPX2, and a third sub-pixel SPX3.

The sub-pixels SPX1, SPX2, and SPX3 may emit light of different colors. For example, the first sub-pixel SPX1 may emit light of a first color, the second sub-pixel SPX2 may emit light of a second color, and the third sub-pixel SPX3 may emit light of a third color. For example, the first sub-pixel SPX1 may be a red pixel emitting red light, the second sub-pixel SPX2 may be a green pixel emitting green light, and the third sub-pixel SPX3 may be a blue pixel emitting blue light, but the disclosure is not limited thereto.

In an embodiment, the first sub-pixel SPX1, the second sub-pixel SPX2, and the third sub-pixel SPX3 may emit the light of the first color, the second color, and the third color by including a light emitting element of the first color, a light emitting element of the second color, and a light emitting element of the third color, respectively. In an embodiment, the first sub-pixel SPX1, the second sub-pixel SPX2, and the third sub-pixel SPX3 may include light emitting elements emitting light of a same color, and may emit the light of the first color, the second color, and the third color by including color conversion layers and/or color filters of different colors disposed on the respective light emitting elements. However, a color, a type, the number, and/or the like of the sub-pixels SPX1, SPX2, and SPX3 configuring each pixel PXL are/is not particularly limited. For example, a color of light emitted by each pixel PXL may be variously changed.

The sub-pixels SPX1, SPX2, and SPX3 may be regularly arranged (or disposed) according to a stripe or PENTILE™ arrangement structure, or the like within the spirit and the scope of the disclosure. For example, the first to third sub-pixels SPX1, SPX2, and SPX3 may be sequentially disposed along a first direction (X-axis direction) and repeatedly disposed along a second direction (Y-axis direction). The first to third sub-pixels SPX1, SPX2, and SPX3 adjacent to each other may form one pixel PXL capable of emitting light of various colors. However, an arrangement structure of the sub-pixels SPX1, SPX2, and SPX3 is not limited thereto, and the sub-pixels SPX1, SPX2, and SPX3 may be arranged in the display area DA in various structures and/or methods.

In an embodiment, each of the sub-pixels SPX1, SPX2, and SPX3 may be an active type pixel. For example, each of the sub-pixels SPX1, SPX2, and SPX3 may include at least one light source (for example, a light emitting element) driven by a control signal (for example, a scan signal and a data signal) and/or power (for example, first power and second power). However, a type, a structure, and/or a driving method of the sub-pixels SPX1, SPX2, and SPX3 applicable to the display device are/is not particularly limited.

Figure 2:
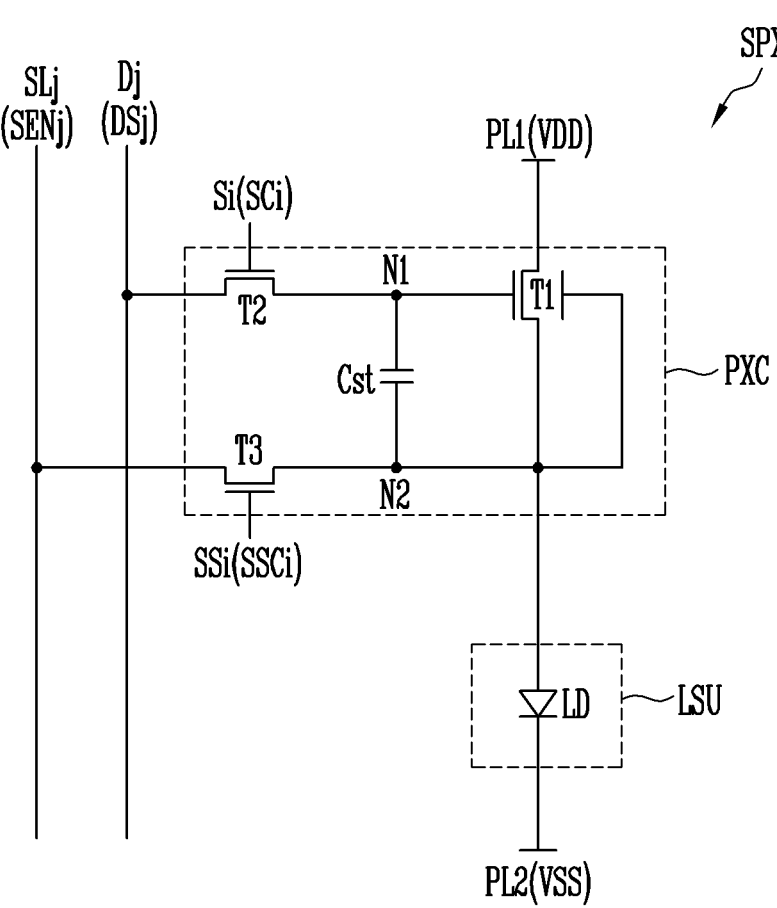
FIGS. 2 to 4 are schematic diagrams of an equivalent circuit illustrating a sub-pixel according to an embodiment.
Figure 3:
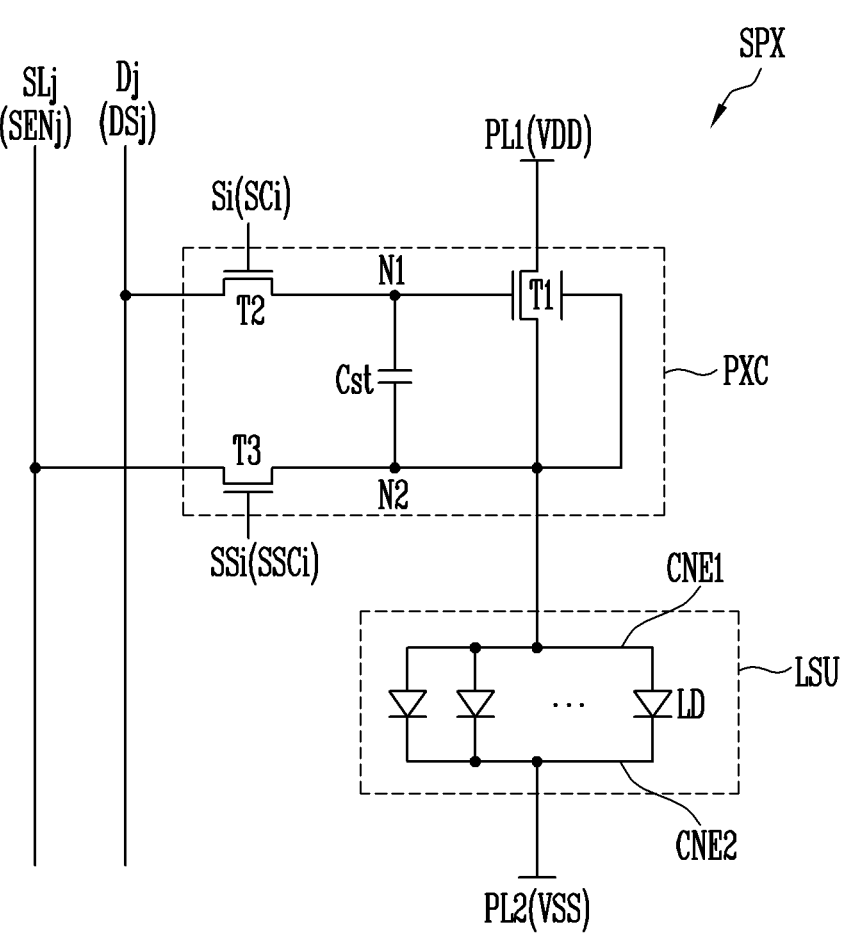
Figure 4:
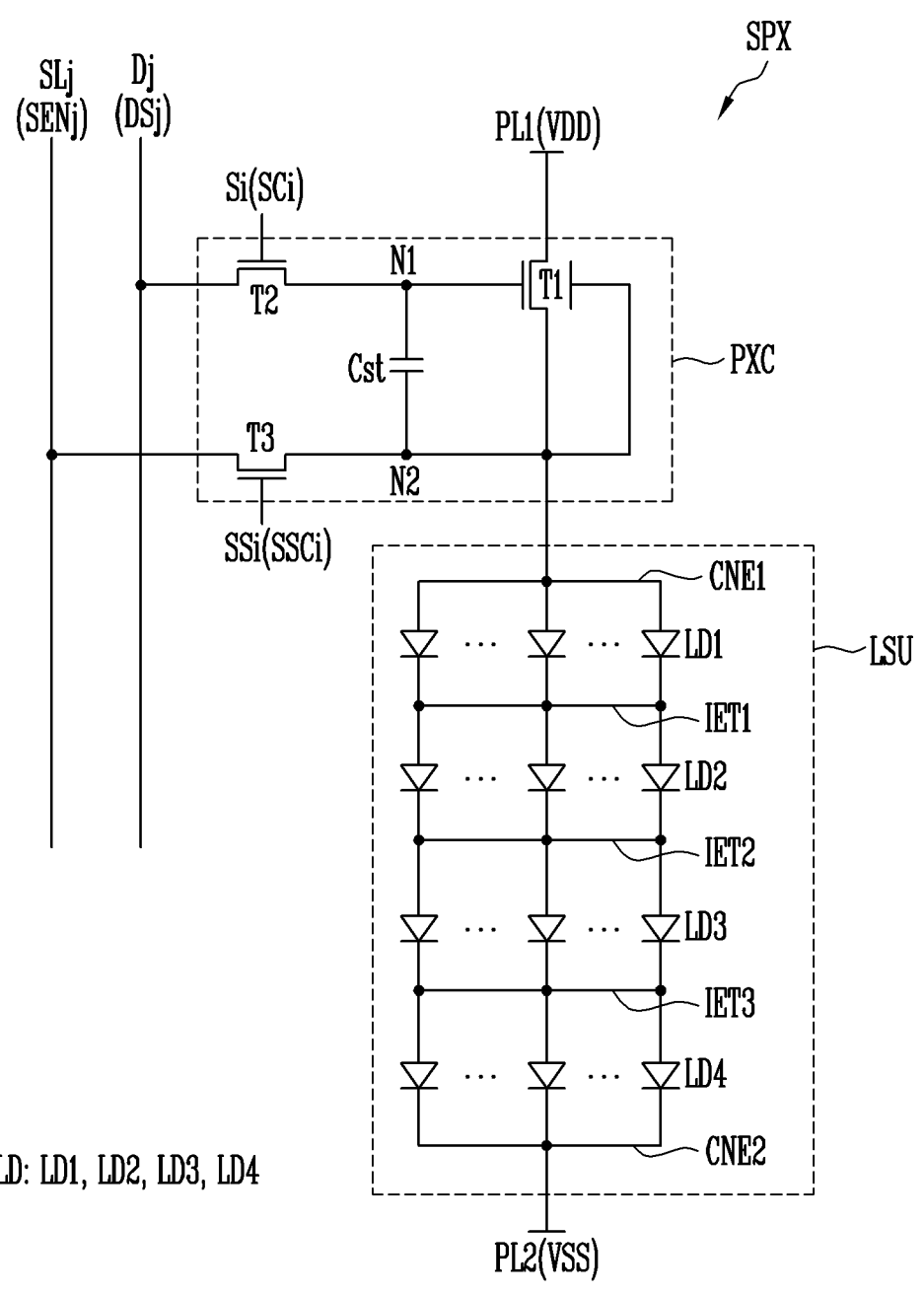

FIGS. 2 to 4 are schematic diagrams of an equivalent circuit illustrating a sub-pixel according to an embodiment.

According to an embodiment, the sub-pixel SPX shown in FIGS. 2 to 4 may be any one of the first sub-pixel SPX1, the second sub-pixel SPX2, and the third sub-pixel SPX3 provided in the display panel PNL of FIG. 1. The first sub-pixel SPX1, the second sub-pixel SPX2, and the third sub-pixel SPX3 may have structures identical or similar to each other.

Referring to FIGS. 2 to 4, the sub-pixel SPX may include a light source unit LSU for generating light of a luminance corresponding to a data signal, and a pixel circuit PXC for driving the light source unit LSU.

The light source unit LSU may include at least one light emitting element LD electrically connected between first power VDD and second power VSS. The first power VDD and the second power VSS may have different potentials so that the light emitting element LD emits light. For example, the first power VDD may be set as high potential power, and the second power VSS may be set as low potential power. At this time, a potential difference between the first power VDD and the second power VSS may be set to be equal to or greater than a threshold voltage of the light emitting element LD during at least an emission period of the sub-pixel SPX.

The light emitting element LD may emit light with a luminance corresponding to a driving current supplied through the pixel circuit PXC. The light emitting element LD may be formed of an organic light emitting diode, or an inorganic light emitting diode such as a micro light emitting diode or a quantum dot light emitting diode. In an embodiment, the light emitting element LD may be a light emitting diode of an ultra-small size, for example, a size as small as a nano-scale to a micro-scale, using a material of an inorganic crystal structure.

In an embodiment, the light source unit LSU may include light emitting elements LD connected in parallel to each other. As shown in FIG. 3, the light source unit LSU may include a first electrode CNE1 electrically connected to the first power VDD via the pixel circuit PXC and a first power line PL1, a second electrode CNE2 electrically connected to the second power VSS through a second power line PL2, and the light emitting elements LD electrically connected between the first and second electrodes CNE1 and CNE2. In an embodiment, the first electrode CNE1 may be an anode electrode or may correspond to the anode electrode, and the second electrode CNE2 may be a cathode electrode or may correspond to the cathode electrode.

The light emitting element LD may include a first end (for example, a p-type end) electrically connected to the first power VDD through the first electrode CNE1 and/or the pixel circuit PXC, and a second end (for example, an n-type end) electrically connected to the second power VSS through the second electrode CNE2. For example, the light emitting element LD may be connected in parallel in a forward direction between the first and second electrodes CNE1 and CNE2. Each of the light emitting elements LD connected in the forward direction between the first power VDD and the second power VSS may form each effective light source, and the effective light sources may be collected to form the light source unit LSU of the pixel PXL.

The first end of the light emitting element LD may be commonly connected to the pixel circuit PXC through one electrode (for example, the first electrode CNE1) of the light source unit LSU, and may be electrically connected to the first power VDD through the pixel circuit PXC and the first power line PL1. The second end of the light emitting element LD may be commonly connected to the second power VSS through another electrode (for example, the second electrode CNE2) of the light source unit LSU and the second power line PL2.

In an embodiment, the light source unit LSU may include light emitting elements LD connected in series. The light source unit LSU may include at least one series stage. Each series stage may include a pair of electrodes (for example, two electrodes) and at least one light emitting element LD connected in a forward direction between the pair of electrodes. Here, the number of series stages configuring the light source unit LSU and the number of light emitting elements LD configuring each series stage are not particularly limited. For example, the number of light emitting elements LD configuring each series stage may be the same as or different from each other, and the number of light emitting elements LD is not particularly limited.

The light source unit LSU may include a first series stage including at least one first light emitting element LD1, a second series stage including at least one second light emitting element LD2, a third series stage including at least one third light emitting element LD3, and a fourth series stage including at least one fourth light emitting element LD4.

The first series stage may include the first electrode CNE1 and a first intermediate electrode IET1, and at least one first light emitting element LD1 electrically connected between the first electrode CNE1 and the first intermediate electrode IET1. For example, a first end of the first light emitting element LD1 may be electrically connected to the first electrode CNE1, and a second end of the first light emitting element LD1 may be electrically connected to the first intermediate electrode IET1.

The second series stage may include the first intermediate electrode IET1 and a second intermediate electrode IET2, and at least one second light emitting element LD2 electrically connected between the first intermediate electrode IET1 and the second intermediate electrode IET2. For example, a first end of the second light emitting element LD2 may be electrically connected to the first intermediate electrode IET1, and a second end of the second light emitting element LD2 may be electrically connected to the second intermediate electrode IET2.

The third series stage may include the second intermediate electrode IET2 and a third intermediate electrode IET3, and at least one third light emitting element LD3 electrically connected between the second intermediate electrode IET2 and the third intermediate electrode IET3. For example, a first end of the third light emitting element LD3 may be electrically connected to the second intermediate electrode IET2, and a second end of the third light emitting element LD3 may be electrically connected to the third intermediate electrode IET3.

The fourth series stage may include the third intermediate electrode IET3 and the second electrode CNE2, and at least one fourth light emitting element LD4 electrically connected between the third intermediate electrode IET3 and the second electrode CNE2. For example, a first end of the fourth light emitting element LD4 may be electrically connected to the third intermediate electrode IET3, and a second end of the fourth light emitting element LD4 may be electrically connected to the second electrode CNE2.

In case that the light emitting elements LD are connected in a series/parallel structure, power efficiency may be improved compared to a case where a same number of light emitting elements LD are connected only in parallel. In the sub-pixel SPX in which the light emitting elements LD are connected in the series/parallel structure, even though a short defect or the like occurs in some series stages, since a luminance may be expressed through the light emitting elements LD of remaining series stages, a dark spot defect possibility of the sub-pixel SPX may be reduced. However, the disclosure is not limited thereto, and the light source unit LSU may be formed by connecting the light emitting elements LD only in series, or the light source unit LSU may be formed by connecting the light emitting elements LD only in parallel.

The pixel circuit PXC may be electrically connected between the first power VDD and the light source unit LSU. The pixel circuit PXC may be electrically connected to a scan line Si (or a gate line) and a data line Dj. The pixel circuit PXC may be further electrically connected to a sensing control line SSi and a sensing line SLj. For example, in case that the sub-pixel SPX is disposed on an i-th (i is a natural number) horizontal line (row, or pixel row) and a j-th (j is a natural number) vertical line (column, or pixel column) of the display area DA, the pixel circuit PXC of the sub-pixel SPX may be electrically connected to an i-th scan line Si, an i-th sensing control line SSi, a j-th data line Dj, and the sensing line SLj of the display area DA.

According to an embodiment, the pixel circuit PXC may include transistors and at least one capacitor. For example, the pixel circuit PXC may include a first transistor T1, a second transistor T2, a third transistor T3, and a storage capacitor Cst.

The first transistor T1 may be electrically connected between the first power VDD and the light source unit LSU. For example, a first electrode (for example, a drain electrode) of the first transistor T1 may be electrically connected to the first power VDD, and a second electrode (for example, a source electrode) of the first transistor T1 may be electrically connected to one electrode (for example, the anode electrode) of the light source unit LSU. A gate electrode of the first transistor T1 may be electrically connected to a first node N1. A back gate electrode of the first transistor T1 may be electrically connected to a second node N2. The first transistor T1 may control the driving current supplied to the light source unit LSU in response to a voltage of the first node N1. For example, the first transistor T1 may be a driving transistor that controls the driving current of the sub-pixel SPX.

The second transistor T2 is electrically connected between the data line Dj and the first node N1. For example, a first electrode (for example, a source electrode) of the second transistor T2 may be electrically connected to the data line Dj, and a second electrode (for example, a drain electrode) of the second transistor T2 may be electrically connected to the first node N1. A gate electrode of the second transistor T2 may be electrically connected to the scan line Si. The second transistor T2 may be turned on in case that a scan signal SCi of a gate-on voltage (for example, a high level voltage) is supplied from the scan line Si, to electrically connect the data line Dj and the first node N1. In each frame period, a data signal DSj of a corresponding frame may be supplied to the data line Dj, and the data signal DSj may be transferred to the first node N1 through the second transistor T2 turned on during a period in which the scan signal SCi of the gate-on voltage is supplied. For example, the second transistor T2 may be a switching transistor for transferring each data signal DSj to an inside of the sub-pixel SPX.

The third transistor T3 may be electrically connected between the first transistor T1 and the sensing line SLj. For example, a first electrode of the third transistor T3 may be electrically connected to the sensing line SLj, and a second electrode of the third transistor T3 may be electrically connected to the second node N2 (or the second electrode of the first transistor T1). A gate electrode of the third transistor T3 may be connected to the sensing control line SSi. In case that the sensing control line SSi is omitted, the gate electrode of the third transistor T3 may be connected to the scan line Si (a previous scan line positioned in a row previous to the scan line Si or a subsequent scan line positioned in a row subsequent to the scan line Si). The third transistor T3 may be turned on by a sensing control signal SSCi of a gate-on voltage supplied to the sensing control line SSi during a sensing period, to electrically connect the sensing line SLj and the first transistor T1.

According to an embodiment, the sensing period may be a period in which a characteristic (for example, a threshold voltage or the like of the first transistor T1) of the sub-pixel SPX disposed in the display area DA is extracted. During the sensing period, a reference voltage at which the first transistor T1 may be turned on may be supplied to the first node N1 through the data line Dj and the second transistor T2, or each sub-pixel SPX may be connected to a current source or the like, to turn on the first transistor T1. Since the third transistor T3 is turned on by supplying the sensing control signal SSCi of the gate-on voltage to the third transistor T3, the first transistor T1 may be electrically connected to the sensing line SLj. Thereafter, a sensing signal SENj may be output to an external device through the sensing line SLj, and the characteristic of each sub-pixel SPX including the threshold voltage or the like of the first transistor T1 may be detected using the sensing signal SENj.

A first electrode of the storage capacitor Cst may be electrically connected to the second node N2, and a second electrode of the storage capacitor Cst may be electrically connected to the first node N1. The storage capacitor Cst may charge a voltage corresponding to the data signal DSj supplied to the first node N1 during each frame period.

In FIGS. 2 to 4, all transistors included in the pixel circuit PXC, for example, the first to third transistors T1, T2, and T3 are N-type transistors, but the disclosure is not limited thereto. At least one of the first to third transistors T1, T2, and T3 may be changed to a P-type transistor. The pixel circuit PXC may be a pixel circuit of various structures and/or driving methods.

Figure 5:
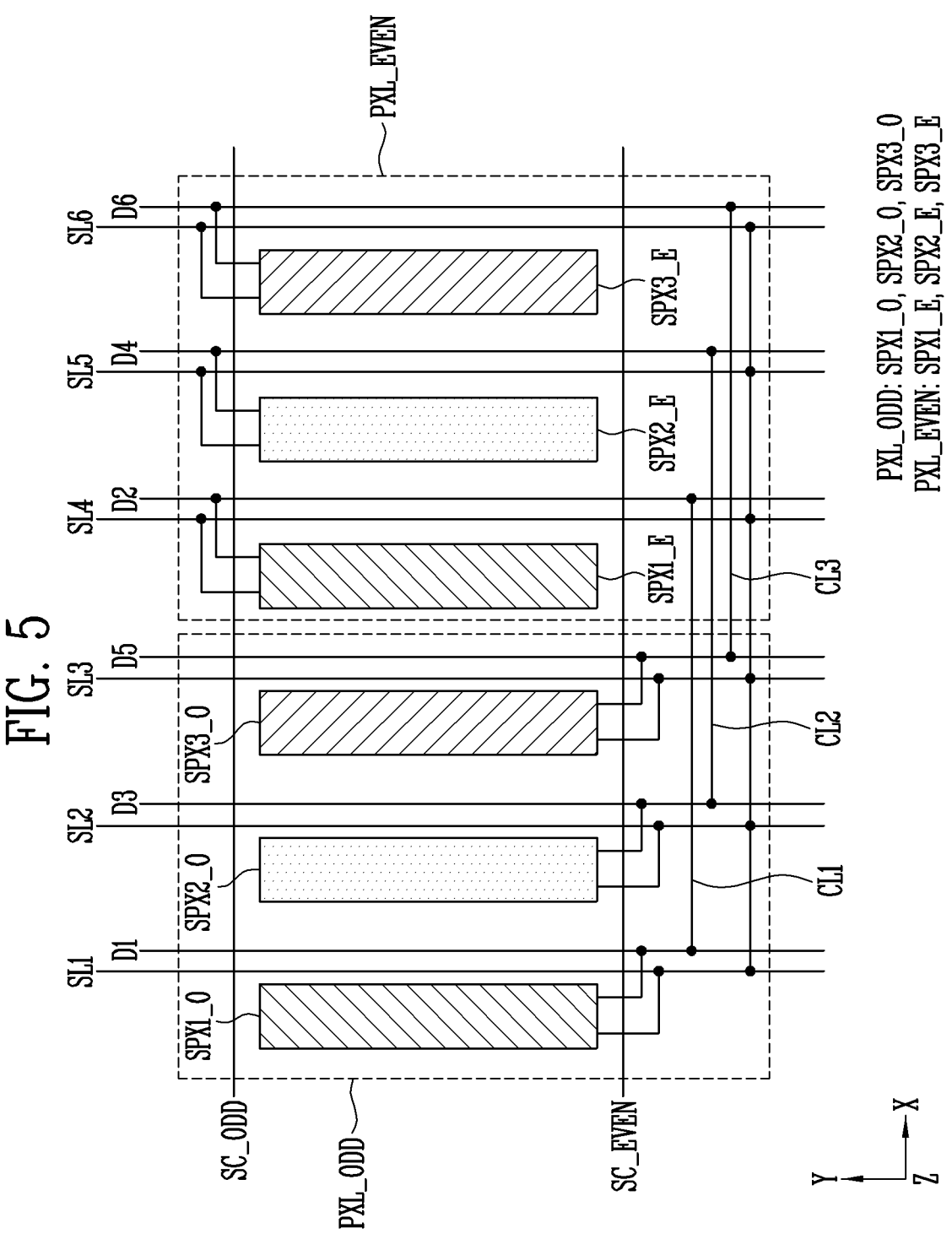
FIG. 5 is a schematic diagram of an equivalent circuit illustrating a first pixel and a second pixel according to an embodiment.

FIG. 5 is a schematic diagram of an equivalent circuit illustrating a first pixel and a second pixel according to an embodiment. FIG. 5 shows some or a number of sub-pixels SPX1_O, SPX2_O, SPX3_O, SPX1_E, SPX2_E, and SPX3_E included in one horizontal line.

Referring to FIG. 5, a first pixel PXL_ODD (an odd-numbered pixel, or a pixel of an odd-numbered column) and a second pixel PXL_EVEN (an even-numbered pixel, or a pixel of an even-numbered column) may be positioned on a same horizontal line (or a same pixel row). The first pixel PXL_ODD and the second pixel PXL_EVEN may be adjacent to each other in a same pixel row. The first pixel PXL_ODD and the second pixel PXL_EVEN are two adjacent pixels PXL named according to positions thereof, and each of the first pixel PXL_ODD and the second pixel PXL_EVEN may be the same as the pixel PXL. The first pixel PXL_ODD and the second pixel PXL_EVEN may be sequentially and repeatedly arranged in the first direction (X-axis direction).

The first pixel PXL_ODD may include first to third sub-pixels SPX1_O, SPX2_O, and SPX3_O, and the second pixel PXL_EVEN may include first to third sub-pixels SPX1_E, SPX2_E, and SPX3_E.

The first to third sub-pixels SPX1_O, SPX2_O, and SPX3_O of the first pixel PXL_ODD may have a same pixel structure, and the first to third sub-pixels SPX1_E, SPX2_E, and SPX3_E of the second pixel PXL_EVEN may have a same pixel structure.

A first gate line SC_ODD and a second gate line SC_EVEN may extend in the first direction (X-axis direction) and may be arranged in the second direction (Y-axis direction).

The first to third sub-pixels SPX1_O, SPX2_O, and SPX3_O of the first pixel PXL_ODD may be electrically connected to the first gate line SC_ODD, and the first to third sub-pixels SPX1_E, SPX2_E, and SPX3_E of the second pixel PXL_EVEN may be electrically connected to the second gate line SC_EVEN. The sub-pixels SXP1_O, SPX2_O, SPX3_O, SPX1_E, SPX2_E, and SPX3_E included in one horizontal line may be sequentially arranged along the first direction (X-axis direction).

Data lines D1, D2, D3, D4, D5, and D6 may extend in the second direction (Y-axis direction) and may be arranged along the first direction (X-axis direction). A distance between the data lines D1, D2, D3, D4, D5, and D6 may be the same as a distance between the sub-pixels SXP1_O, SPX2_O, SPX3_O, SPX1_E, SPX2_E, and SPX3_E. For example, the data lines D1, D2, D3, D4, D5, and D6 may be spaced apart from each other with one of the sub-pixels SXP1_O, SPX2_O, SPX3_O, SPX1_E, SPX2_E, and SPX3_E interposed therebetween.

Sensing lines SL1, SL2, SL3, SL4, SL5, and SL6 may extend in the second direction (Y-axis direction) and may be arranged along the first direction (X-axis direction). A distance between the sensing lines SL1, SL2, SL3, SL4, SL5, and SL6 may be the same as the distance between the data lines D1, D2, D3, D4, D5, and D6, but is not limited thereto.

The data lines D1, D2, D3, D4, D5, and D6 and the sensing lines SL1, SL2, SL3, SL4, SL5, and SL6 may be disposed in pairs. One of the data lines D1, D2, D3, D4, D5, and D6 and one of the sensing lines SL1, SL2, SL3, SL4, SL5, and SL6 may be disposed in a pair between two adjacent sub-pixels SXP1_O, SPX2_O, SPX3_O, SPX1_E, SPX2_E, and SPX3_E.

The sub-pixels SXP1_O, SPX2_O, SPX3_O, SPX1_E, SPX2_E, and SPX3_E may be connected to the most adjacent data lines D1, D2, D3, D4, D5, and D6, respectively. The first sub-pixel SPX1_O of the first pixel PXL_ODD may be electrically connected to a first data line D1, and the first sub-pixel SPX1_E of the second pixel PXL_EVEN may be electrically connected to a second data line D2. The second sub-pixel SPX2_O of the first pixel PXL_ODD may be electrically connected to a third data line D3, and the second sub-pixel SPX2_E of the second pixel PXL_EVEN may be electrically connected to a fourth data line D4. The third sub-pixel SPX3_O of the first pixel PXL_ODD may be electrically connected to a fifth data line D5, and the third sub-pixel SPX3_E of the second pixel PXL_EVEN may be electrically connected to a sixth data line D6.

The data lines D1, D2, D3, D4, D5, and D6 electrically connected to the sub-pixels SXP1_O, SPX2_O, SPX3_O, SPX1_E, SPX2_E, and SPX3_E that emit light in a same color may be electrically connected to each other. For example, the first data line D1 and the second data line D2 may be electrically connected to each other by a first connection line CL1. The third data line D3 and the fourth data line D4 may be electrically connected to each other by a second connection line CL2. The fifth data line D5 and the sixth data line D6 may be electrically connected to each other by a third connection line CL3.

Since the two sub-pixels SXP1_O, SPX2_O, SPX3_O, SPX1_E, SPX2_E, and SPX3_E that emit light in a same color share the data lines D1, D2, D3, D4, D5, and D6, respectively, the number of channels of a driver providing a signal to the data lines D1, D2, D3, D4, D5, and D6 and the entire load according to the number of channels may be reduced.

The first data line D1 may be disposed between the first sub-pixel SPX1_O and the second sub-pixel SPX2_O of the first pixel PXL_ODD. The second data line D2 may be disposed between the first sub-pixel SPX1_E and the second sub-pixel SPX2_E of the second pixel PXL_EVEN. The third data line D3 may be disposed between the second sub-pixel SPX2_O and the third sub-pixel SPX3_O of the first pixel PXL_ODD. The fourth data line D4 may be disposed between the second sub-pixel SPX2_E and the third sub-pixel SPX3_E of the second pixel PXL_EVEN. The fifth data line D5 may be disposed between the third sub-pixel SPX3_O of the first pixel PXL_ODD and the first sub-pixel SPX1_E of the second pixel PXL_EVEN. The sixth data line D6 may be disposed between the third sub-pixel SPX3_E of the second pixel PXL_EVEN and the first sub-pixel SPX1_O of the first pixel PXL_ODD.

The respective sub-pixels SXP1_O, SPX2_O, SPX3_O, SPX1_E, SPX2_E, and SPX3_E may be connected to the most adjacent sensing lines SL1, SL2, SL3, SL4, SL5, and SL6. The first sub-pixel SPX1_O of the first pixel PXL_ODD may be electrically connected to a first sensing line SL1. The second sub-pixel SPX2_O of the first pixel PXL_ODD may be electrically connected to a second sensing line SL2. The third sub-pixel SPX3_O of the first pixel PXL_ODD may be electrically connected to a third sensing line SL3. The first sub-pixel SPX1_E of the second pixel PXL_EVEN may be electrically connected to a fourth sensing line SL4. The second sub-pixel SPX2_E of the second pixel PXL_EVEN may be electrically connected to a fifth sensing line SL5. The third sub-pixel SPX3_E of the second pixel PXL_EVEN may be electrically connected to a sixth sensing line SL6.

The first sensing line SL1 may be disposed between the first sub-pixel SPX1_O and the second sub-pixel SPX2_O of the first pixel PXL_ODD. The second sensing line SL2 may be disposed between the second sub-pixel SPX2_O and the third sub-pixel SPX3_O of the first pixel PXL_ODD. The third sensing line SL3 may be disposed between the third sub-pixel SPX3_O of the first pixel PXL_ODD and the first sub-pixel SPX1_E of the second pixel PXL_EVEN. The fourth sensing line SL4 may be disposed between the first sub-pixel SPX1_E and the second sub-pixel SPX2_E of the second pixel PXL_EVEN. The fifth sensing line SL5 may be disposed between the second sub-pixel SPX2_E and the third sub-pixel SPX3_E of the second pixel PXL_EVEN. The sixth sensing line SL6 may be disposed between the third sub-pixel SPX3_E of the second pixel PXL_EVEN and the first sub-pixel SPX1_O of the first pixel PXL_ODD.

The sensing lines SL1, SL2, SL3, SL4, SL5, and SL6 may be electrically connected to each other, but are not limited thereto.

Figure 6:
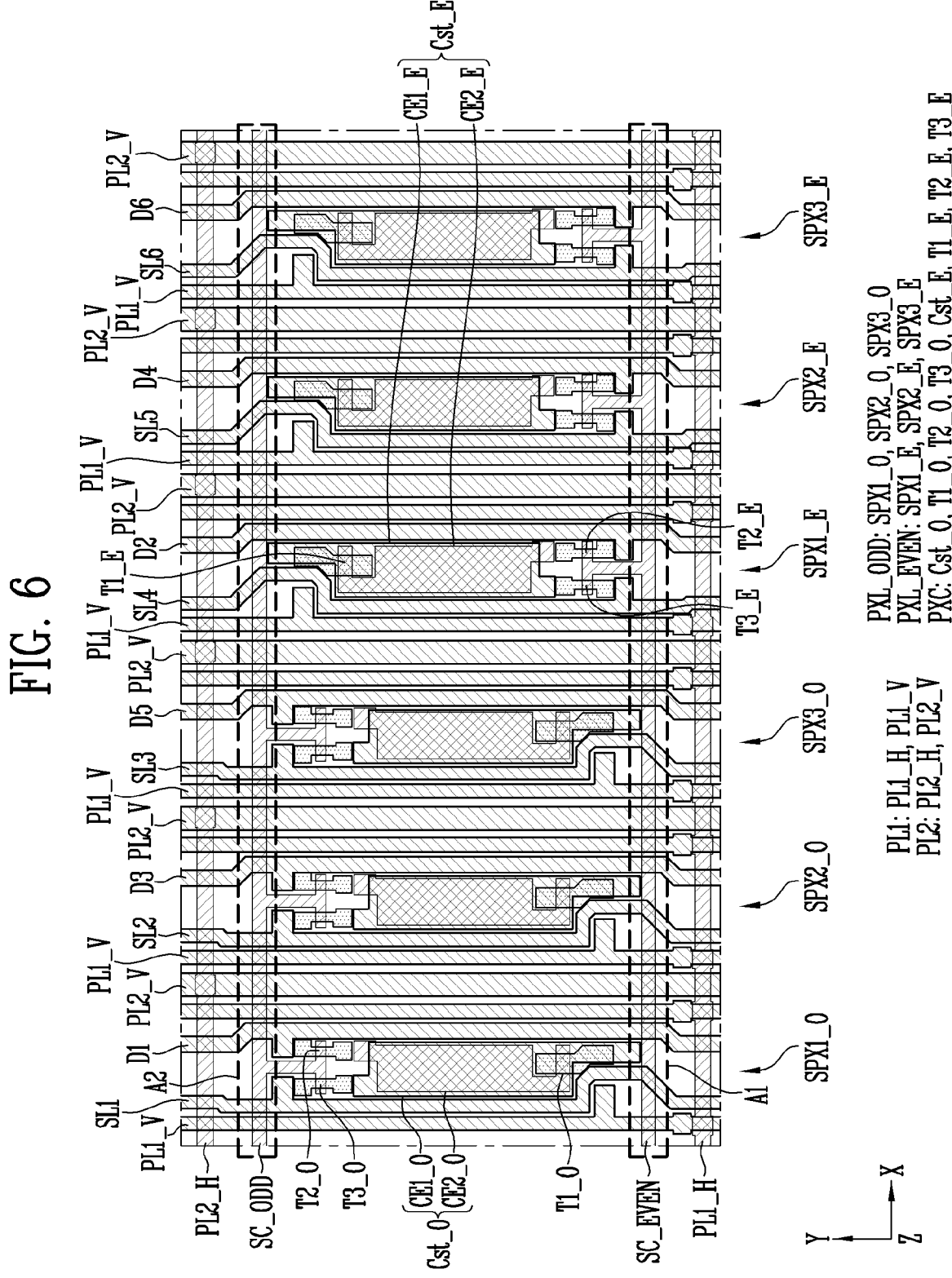
FIGS. 6 and 7 are schematic plan views illustrating a first pixel and a second pixel according to an embodiment.
Figure 7:
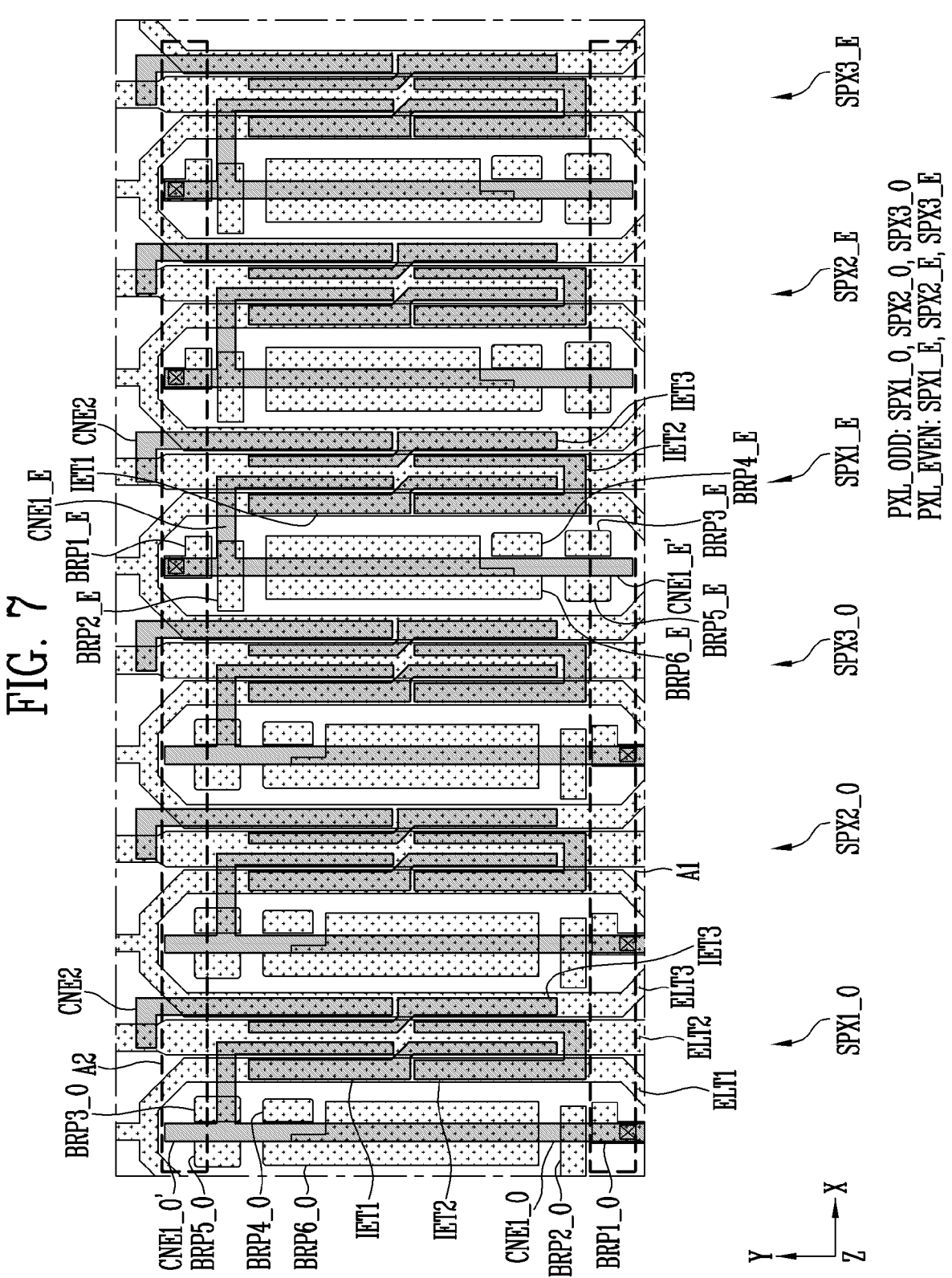
Figure 8:
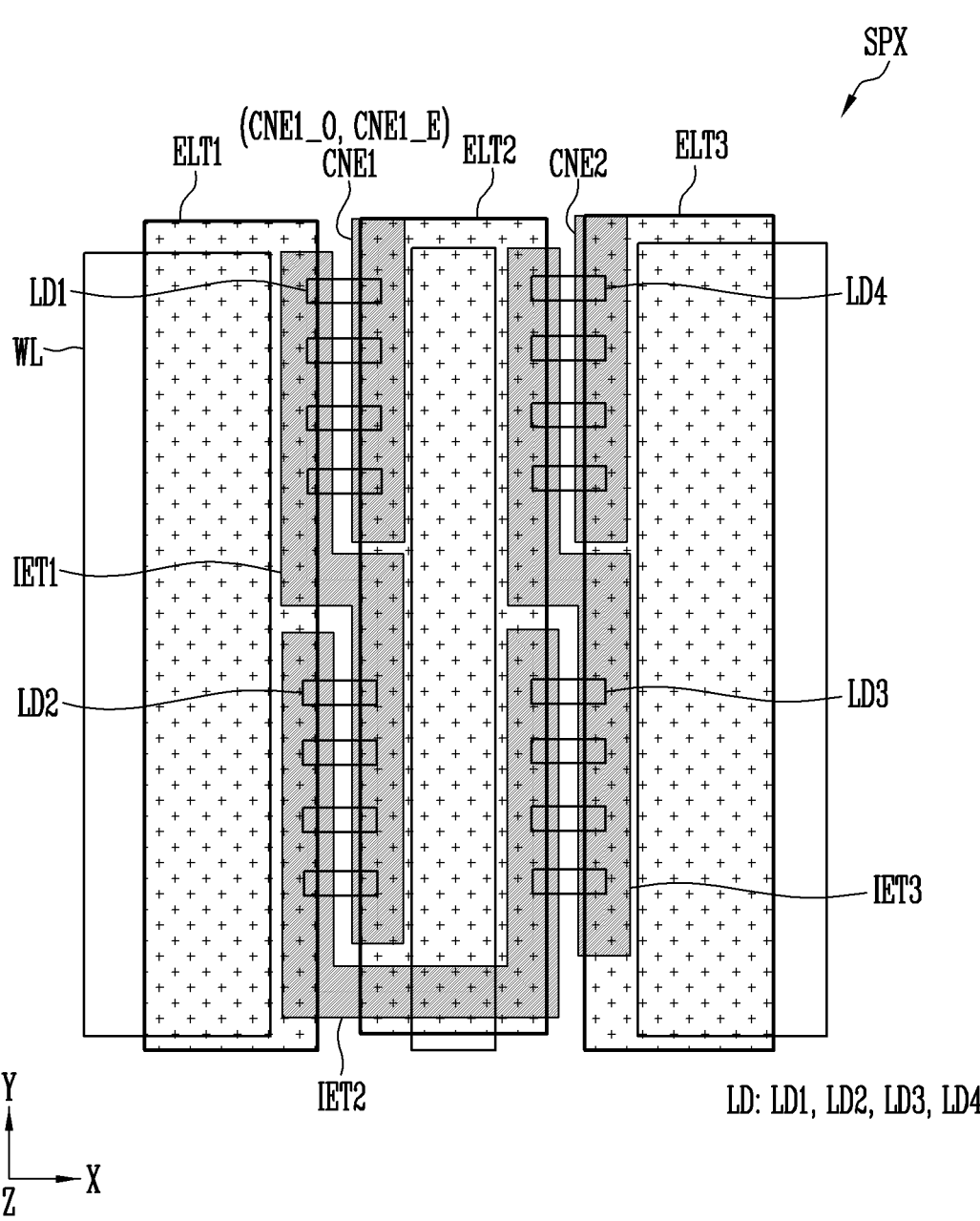
FIG. 8 is a schematic plan view illustrating a sub-pixel according to an embodiment.

FIGS. 6 and 7 are schematic plan views illustrating a first pixel and a second pixel according to an embodiment. In FIG. 6, a schematic plan view of the first pixel PXL_ODD and the second pixel PXL_EVEN is shown based on a pixel circuit PXC (or a pixel circuit layer). In FIG. 7, a schematic plan view of the first pixel PXL_ODD and the second pixel PXL_EVEN is shown based on a display element layer. FIG. 8 is a schematic plan view illustrating a sub-pixel according to an embodiment. In FIG. 8, the sub-pixel SPX is briefly shown based on the light source unit LSU. For example, the sub-pixel SPX of FIG. 8 may be any one of the sub-pixels SPX1_O, SPX2_O, and SPX3_O of the first pixel PXL_ODD and/or the sub-pixels SPX1_E, SPX2_E, and SPX3_E of the second pixel PXL_EVEN, and the light source unit LSU of the sub-pixels SPX may have structures identical or similar to each other. In FIG. 8, an embodiment in which the sub-pixel SPX may include the light emitting elements LD disposed in four series stages as shown in FIG. 4 is disclosed, but the number of series stages of each sub-pixel SPX may be variously changed according to an embodiment.

Referring to FIGS. 6 to 8, the first to third sub-pixels SPX1_O, SPX2_O, and SPX3_O of the first pixel PXL_ODD may have pixel structures (or circuit structures) identical or similar to each other. The first to third sub-pixels SPX1_E, SPX2_E, and SPX3_E of the second pixel PXL_EVEN may have pixel structures (or circuit structures) identical or similar to each other. Each of the first to third sub-pixels SPX1_O, SPX2_O, and SPX3_O of the first pixel PXL_ODD and the first to third sub-pixels SPX1_E, SPX2_E, and SPX3_E of the second pixel PXL_EVEN may have a pixel structure (or a circuit structure) mutually inverted in the second direction (Y-axis direction). Therefore, a common configuration of the sub-pixels SPX is described based on the first sub-pixel SPX1_O of the first pixel PXL_ODD and the first sub-pixel SPX1_E of the second pixel PXL_EVEN, and an overlapping description may be omitted.

A first vertical power line PL1_V, the sensing lines SL1, SL2, SL3, SL4, SL5, and SL6, the data lines D1, D2, D3, D4, D5, and D6, and a second vertical power line PL2_V may extend in the second direction (Y-axis direction), and may be arranged along the first direction (X-axis direction). The first vertical power line PL1_V, the sensing lines SL1, SL2, SL3, SL4, SL5, and SL6, the data lines D1, D2, D3, D4, D5, and D6, and/or the second vertical power line PL2_V may have a partially curved shape, but are/is not limited thereto.

In the first pixel PXL_ODD, the first vertical power line PL1_V and the first sensing line SL1 may be positioned in a left direction with respect to a first capacitor electrode CE1_O of the first sub-pixel SPX1_O, and the first data line D1 and the second vertical power line PL2_V may be positioned in a right direction with respect to the first capacitor electrode CE1_O of the first sub-pixel SPX1_O.

The first vertical power line PL1_V, the sensing lines SL1, SL2, SL3, SL4, SL5, and SL6, the data lines D1, D2, D3, D4, D5, and D6, the second vertical power line PL2_V, and the first capacitor electrode CE1_O may include a same material or a similar material, and may be disposed on a same layer through a same process.

A second horizontal power line PL2_H, the first gate line SC_ODD, the second gate line SC_EVEN, and a first horizontal power line PL1_H may extend in the first direction (X-axis direction), and may be arranged in the second direction (Y-axis direction). The second horizontal power line PL2_H and the first gate line SC_ODD may be positioned in an upper direction with respect to a second capacitor electrode CE2_O of the first sub-pixel SPX1_O, and the second gate line SC_EVEN and the first horizontal power line PL1_H may be disposed in a downward direction with respect to the second capacitor electrode CE2_O of the first sub-pixel SPX1_O.

The second horizontal power line PL2_H, the first gate line SC_ODD, the second gate line SC_EVEN, the first horizontal power line PL1_H, and the second capacitor electrode CE2_O may include a same material or a similar material, and may be disposed on a same layer through a same process.

The first capacitor electrode CE1_O and the second capacitor electrode CE2_O may overlap each other and form a storage capacitor Cst_O (refer to Cst of FIG. 4).

The second horizontal power line PL2_H may intersect the second vertical power line PL2_V, and may be connected to the second vertical power line PL2_V through a contact hole in the crossing area. The second horizontal power line PL2_H and the second vertical power line PL2_V may entirely form a mesh structure, and may form a second power line (refer to PL2 of FIG. 4).

Similarly, the first horizontal power line PL1_H may intersect the first vertical power line PL1_V, and may be connected to the first vertical power line PL1_V through a contact hole in the crossing area. The first horizontal power line PL1_H and the first vertical power line PL1_V may entirely form a mesh structure, and may form a first power line (refer to PL1 of FIG. 4). A disposition of the first horizontal power line PL1_H and the second horizontal power line PL2_H may be mutually changed.

A first transistor T1_O may be positioned in a downward direction with respect to the first and second capacitor electrodes CE1_O and CE2_O, and may partially overlap the first and second capacitor electrodes CE1_O and CE2_O. A central portion of a semiconductor pattern overlapping the first and second capacitor electrodes CE1_O and CE2_O may form a channel of the first transistor T1_O, the second capacitor electrode CE2_O may form a gate of the first transistor T1_O, and the first capacitor electrode CE1_O may form a back gate electrode of the first transistor T1_O. A first portion of the semiconductor pattern of the first transistor T1_O may be electrically connected to a protruding portion of the first vertical power line PL1_V through a second bridge electrode BRP2_O. The first portion of the semiconductor pattern of the first transistor T1_O or the second bridge electrode BRP2_O may be a first electrode of the first transistor T1_O. A second portion of the semiconductor pattern of the first transistor T1_O may be electrically connected to the first capacitor electrode CE1_O at an opening portion of the second capacitor electrode CE2_O. The second portion of the semiconductor pattern of the first transistor T1_O may be a second electrode of the first transistor T1_O.

A second transistor T2_O may be positioned in an upper direction with respect to the first and second capacitor electrodes CE1_O and CE2_O, and may partially overlap the first gate line SC_ODD. A central portion of the semiconductor pattern overlapping the first gate line SC_ODD may form a channel of the second transistor T2_O, and the first gate line SC_ODD may form a gate electrode of the second transistor T2_O. The first gate line SC_ODD may function as a scan line (refer to Si in FIG. 4) of the first sub-pixel SPX1_O of the first pixel PXL_ODD. A first portion of the semiconductor pattern of the second transistor T2_O may be electrically connected to the first data line D1 through a third bridge electrode BRP3_O. The first portion of the semiconductor pattern of the second transistor T2_O or the third bridge electrode BRP3_O may be a first electrode of the second transistor T2_O. A second portion of the semiconductor pattern of the second transistor T2_O may be electrically connected to the second capacitor electrode CE2_O through a fourth bridge electrode BRP4_O. The second portion of the semiconductor pattern of the second transistor T2_O or the fourth bridge electrode BRP4_O may be a second electrode of the second transistor T2_O.

A third transistor T3_O may be positioned in an upper direction with respect to the first and second capacitor electrodes CE1_O and CE2_O, and may partially overlap the first gate line SC_ODD. A central portion of the semiconductor pattern overlapping the first gate line SC_ODD may form a channel of the third transistor T3_O, and the first gate line SC_ODD may form a gate electrode of the third transistor T3_O. The first gate line SC_ODD may function as a sensing control line (refer to SSi of FIG. 4) of the first sub-pixel SPX1_O of the first pixel PXL_ODD. A first portion of the semiconductor pattern of the third transistor T3_O may be electrically connected to the first sensing line SL1 through a fifth bridge electrode BRP5_O. The first portion of the semiconductor pattern of the third transistor T3_O or the fifth bridge electrode BRP5_O may be a first electrode of the third transistor T3_O. A second portion of the semiconductor pattern of the third transistor T3_O may be electrically connected to the first capacitor electrode CE1_O through a sixth bridge electrode BRP6_O. The second portion of the semiconductor pattern of the third transistor T3_O or the sixth bridge electrode BRP6_O may be a second electrode of the third transistor T3_O.

In the second pixel PXL_EVEN, the first vertical power line PL1_V and the fourth sensing line SL4 may be positioned in a left direction with respect to the first capacitor electrode CE1_E of the first sub-pixel SPX1_E, and the second data line D2 and the second vertical power line PL2_V may be positioned in a right direction with respect to the first capacitor electrode CE1_E of the first sub-pixel SPX1_E.

The second horizontal power line PL2_H and the first gate line SC_ODD may be positioned in an upper direction with respect to the second capacitor electrode CE2_E of the first sub-pixel SPX1_E, and the second gate line SC_EVEN and the first horizontal power line PL1_H may be disposed in a lower direction with respect to the second capacitor electrode CE2_E of the first sub-pixel SPX1_E.

The first capacitor electrode CE1_E and the second capacitor electrode CE2_E may overlap each other and form a storage capacitor Cst_E.

A first transistor T1_E may be positioned in an upper direction with respect to the first and second capacitor electrodes CE1_E and CE2_E, and may partially overlap the first and second capacitor electrodes CE1_E and CE2_E. A central portion of a semiconductor pattern overlapping the first and second capacitor electrodes CE1_E and CE2_E may form a channel of the first transistor T1_E, the second capacitor electrode CE2_E form a gate of the first transistor T1_E, and the first capacitor electrode CE1_E may form a back gate electrode of the first transistor T1_E. A first portion of the semiconductor pattern of the first transistor T1_E may be electrically connected to a protruding portion of the first vertical power line PL1_V through a second bridge electrode BRP2_E. The first portion of the semiconductor pattern of the first transistor T1_E or the second bridge electrode BRP2_E may be a first electrode of the first transistor T1_E. A second portion of the semiconductor pattern of the first transistor T1_E may be electrically connected to the first capacitor electrode CE1_E at an opening portion of the second capacitor electrode CE2_E. A second portion of the semiconductor pattern of the first transistor T1_E may be a second electrode of the first transistor T1_E.

A second transistor T2_E may be positioned in a downward direction with respect to the first and second capacitor electrodes CE1_E and CE2_E, and may partially overlap the second gate line SC_EVEN. A central portion of a semiconductor pattern overlapping the second gate line SC_EVEN may form a channel of the second transistor T2_E, and the second gate line SC_EVEN may form a gate electrode of the second transistor T2_E. The second gate line SC_EVEN may function as a scan line (refer to Si of FIG. 4) of the first sub-pixel SPX1_E of the second pixel PXL_EVEN. A first portion of the semiconductor pattern of the second transistor T2_E may be electrically connected to the second data line D2 through a third bridge electrode BRP3_E. The first portion of the semiconductor pattern of the second transistor T2_E or the third bridge electrode BRP3_E may be a first electrode of the second transistor T2_E. A second portion of the semiconductor pattern of the second transistor T2_E may be electrically connected to the second capacitor electrode CE2_E through a fourth bridge electrode BRP4_E. The second portion of the semiconductor pattern of the second transistor T2_E or the fourth bridge electrode BRP4_E may be a second electrode of the second transistor T2_E.

A third transistor T3_E may be positioned in a downward direction with respect to the first and second capacitor electrodes CE1_E and CE2_E, and may partially overlap the second gate line SC_EVEN. A central portion of the semiconductor pattern overlapping the second gate line SC_EVEN may form a channel of the third transistor T3_E, and the second gate line SC_EVEN may form a gate electrode of the third transistor T3_E. The second gate line SC_EVEN may function as a sensing control line (refer to SSi of FIG. 4) of the first sub-pixel SPX1_E of the second pixel PXL_EVEN. A first portion of the semiconductor pattern of the third transistor T3_E may be electrically connected to the fourth sensing line SL4 through a fifth bridge electrode BRP5_E. The first portion of the semiconductor pattern of the third transistor T3_E or the fifth bridge electrode BRP5_E may be a first electrode of the third transistor T3_E. A second portion of the semiconductor pattern of the third transistor T3_E may be electrically connected to the first capacitor electrode CE1_E through a sixth bridge electrode BRP6_E. The second portion of the semiconductor pattern of the third transistor T3_E or the sixth bridge electrode BRP6_E may be a second electrode of the third transistor T3_E.

The sub-pixels SPX1_O, SPX2_O, and SPX3_O of the first pixel PXL_ODD and the sub-pixels SPX1_E, SPX2_E, and SPX3_E of the second pixel PXL_EVEN may include a same light source unit LSU.

First to third alignment electrodes ELT1, ELT2, and ELT3 may extend in the second direction (Y-axis direction) and may be arranged along the first direction (X-axis direction). The first to third alignment electrodes ELT1, ELT2, and ELT3 adjacent to each other may receive different signals during an alignment step of the light emitting elements LD. For example, in case that the first to third alignment electrodes ELT1, ELT2, and ELT3 are sequentially arranged in the first direction (X-axis direction), the first alignment electrode ELT1 may receive a first alignment signal (or a first alignment voltage), the second alignment electrode ELT2 may receive a second alignment signal (or a second alignment voltage), and the third alignment electrode ELT3 may receive the first alignment signal (or the first alignment voltage), but the disclosure is not limited thereto. After the light emitting element LD is aligned, the first to third alignment electrodes ELT1, ELT2, and ELT3 may be used as driving electrodes for driving the light emitting element LD.

The first to third alignment electrodes ELT1, ELT2, ELT3 may include a same material or a similar material as bridge electrodes BRP1_O, BRP1_E, BRP2_O, BRP2_E, BRP3_O, BRP3_E, BRP4_O, BRP4_E, BRP5_O, BRP5_E, BRP6_O, and BRP6_E, and may be disposed on a same layer through a same process.

According to an embodiment, the sub-pixel SPX may further include bank patterns (refer to WL of FIG. 8). The bank patterns WL may extend along the second direction (Y-axis direction) and may be spaced apart from each other along the first direction (X-axis direction). The bank patterns WL may overlap the first to third alignment electrodes ELT1, ELT2, and ELT3.

According to an embodiment, the bank patterns WL may include a reflective material. Since light emitted from the light emitting elements LD is reflected by the bank patterns WL and emitted in an image display direction of the display device, light output efficiency of the display panel PNL may be improved.

The light emitting elements LD may be disposed between the first to third alignment electrodes ELT1, ELT2, and ELT3. The first light emitting element LD1 may be aligned between the first and second alignment electrodes ELT1 and ELT2. For example, the first light emitting element LD1 may be aligned in a first area (for example, an upper area) of the first and second alignment electrodes ELT1 and ELT2. The first light emitting element LD1 may be electrically connected to the first electrode CNE1 and the first intermediate electrode IET1. The first end of the first light emitting element LD1 may be electrically connected to the first electrode CNE1, and the second end of the first light emitting element LD1 may be electrically connected to the first intermediate electrode IET1.

The second light emitting element LD2 may be aligned between the first and second alignment electrodes ELT1 and ELT2. For example, the second light emitting element LD2 may be aligned in a second area (for example, a lower area) of the first and second alignment electrodes ELT1 and ELT2. The second light emitting element LD2 may be electrically connected to the first intermediate electrode IET1 and the second intermediate electrode IET2. The first end of the second light emitting element LD2 may be electrically connected to the first intermediate electrode IET1, and the second end of the second light emitting element LD2 may be electrically connected to the second intermediate electrode IET2.

The third light emitting element LD3 may be aligned between the second and third alignment electrodes ELT2 and ELT3. For example, the third light emitting element LD3 may be aligned in a second area (for example, a lower area) of the second and third alignment electrodes ELT2 and ELT3. The third light emitting element LD3 may be electrically connected to the second intermediate electrode IET2 and the third intermediate electrode IET3. The first end of the third light emitting element LD3 may be electrically connected to the second intermediate electrode IET2, and the second end of the third light emitting element LD3 may be electrically connected to the third intermediate electrode IET3.

The fourth light emitting element LD4 may be aligned between the second and third alignment electrodes ELT2 and ELT3. For example, the fourth light emitting element LD4 may be aligned in a first area (for example, an upper area) of the second and third electrodes ELT2 and ELT3. The fourth light emitting element LD4 may be electrically connected to the third intermediate electrode IET3 and the second electrode CNE2. The first end of the fourth light emitting element LD4 may be electrically connected to the third intermediate electrode IET3, and the second end of the fourth light emitting element LD4 may be electrically connected to the second electrode CNE2.

The first and second electrodes CNE1 and CNE2 and the first to third intermediate electrodes IET1, IET2 and IET3 may include a same material or a similar material and may be disposed on a same layer through a same process. In case that the first and second electrodes CNE1 and CNE2 and the first to third intermediate electrodes IET1, IET2 and IET3 are formed through a same process, the number of masks may be reduced and a manufacturing process may be simplified. However, the disclosure is not limited thereto, and the first and second electrodes CNE1 and CNE2 and the first to third intermediate electrodes IET1, IET2 and IET3 may be formed of conductive layers according to an embodiment.

In the above-described method, the light emitting elements LD aligned between the first and second electrodes CNE1 and CNE2 and the first to third intermediate electrodes IET1, IET2 and IET3 may be connected in a desired shape. For example, the first to fourth light emitting elements LD1, LD2, LD3, and LD4 may be sequentially connected in series by using the first and second electrodes CNE1 and CNE2 and the first to third intermediate electrodes IET1, IET2, and IET3.

The light emitting elements LD may be electrically connected to the pixel circuit (refer to PXC of FIG. 4) through the first electrode CNE1, and may be electrically connected to the second power line (refer to PL2 of FIG. 4) through the second electrode CNE2.

In an embodiment, a first electrode CNE1_O of the first pixel PXL_ODD and a first electrode CNE1_E of the second pixel PXL_EVEN may be electrically connected to the pixel circuit PXC in different areas A1 and A2. For example, in the first pixel PXL_ODD, the first electrode CNE1_O of the first sub-pixel SPX1_O may be electrically connected to the pixel circuit PXC in the first area A1. For example, the first electrode CNE1_O of the first sub-pixel SPX1_O may be electrically connected to the pixel circuit PXC (or the first transistor T1_O) through a first bridge electrode BRP1_O in the first area A1. The first area A1 may be positioned on one side or a side of the pixel circuit PXC (or the storage capacitors Cst_O and Cst_E), the first transistors T1_O and T1_E, the second transistors T2_O and T2_E, and/or the third transistors T3_O and T3_E. For example, the first area A1 may be positioned on a lower side of the pixel circuit PXC (or the storage capacitors Cst_O and Cst_E), the first transistors T1_O and T1_E, the second transistors T2_O and T2_E, and/or the third transistors T3_O and T3_E.

In the second pixel PXL_EVEN, the first electrode CNE1_E of the first sub-pixel SPX1_E may be electrically connected to the pixel circuit PXC in the second area A2. For example, the first electrode CNE1_E of the first sub-pixel SPX1_E may be electrically connected to the pixel circuit PXC (or the first transistor T1_E) in the second area A2 through a first bridge electrode BRP1_E. The second area A2 may be positioned on another side the pixel circuit PXC (or the storage capacitors Cst_O and Cst_E), the first transistors T1_O and T1_E, the second transistors T2_O and T2_E, and/or the third transistors T3_O and T3_E. For example, the second area A2 may be positioned on an upper side of the pixel circuit PXC (or the storage capacitors Cst_O and Cst_E), the first transistors T1_O and T1_E, the second transistors T2_O and T2_E, and/or the third transistors T3_O and T3_E.

The first electrode CNE1_O of the first sub-pixel SPX1_O in the first pixel PXL_ODD may be formed at a position identical or similar to that of the first electrode CNE1_E of the first sub-pixel SPX1_E in the second pixel PXL_EVEN. For example, the first electrode CNE1_O of the first sub-pixel SPX1_O in the first pixel PXL_ODD may have a shape identical or similar to that of the first electrode CNE1_E of the first sub-pixel SPX1_E in the second pixel PXL_EVEN. The area of the first electrode CNE1_O of the first sub-pixel SPX1_O in the first pixel PXL_ODD may be identical or similar to the area of the first electrode CNE1_E of the first sub-pixel SPX1_E in the second pixel PXL_EVEN. For example, the first electrode CNE1_O of the first sub-pixel SPX1_O in the first pixel PXL_ODD may include a first extension CNE1_O' overlapping the second area A2. The first extension CNE1_O' may extend from the first electrode CNE1_O of the first sub-pixel SPX1_O to the second area A2. The first electrode CNE1_E of the first sub-pixel SPX1_E in the second pixel PXL_EVEN may include a second extension CNE1_E' overlapping the first area A1. The second extension CNE1_E' may extend from the first electrode CNE1_E of the first sub-pixel SPX1_E to the first area A1. Therefore, even though the first electrode CNE1_O of the first sub-pixel SPX1_O in the first pixel PXL_ODD and the first electrode CNE1_E of the first sub-pixel SPX1_E in the second pixel PXL_EVEN are electrically connected to the pixel circuit PXC in the different areas A1 and A2, the first electrodes CNE1_O and CNE1_E may be formed at positions identical or similar to each other in each of the pixels PXL_ODD and PXL_EVEN by including the extensions CNE1_O' and CNE1_E' extending to remaining areas A1 and A2. Accordingly, a capacitance deviation with a lower electrode (for example, electrodes included in the pixel circuit layer PCL) according to an electrode position (or shape) difference of the first pixel PXL_ODD and the second pixel PXL_EVEN may be minimized.

Figure 9:
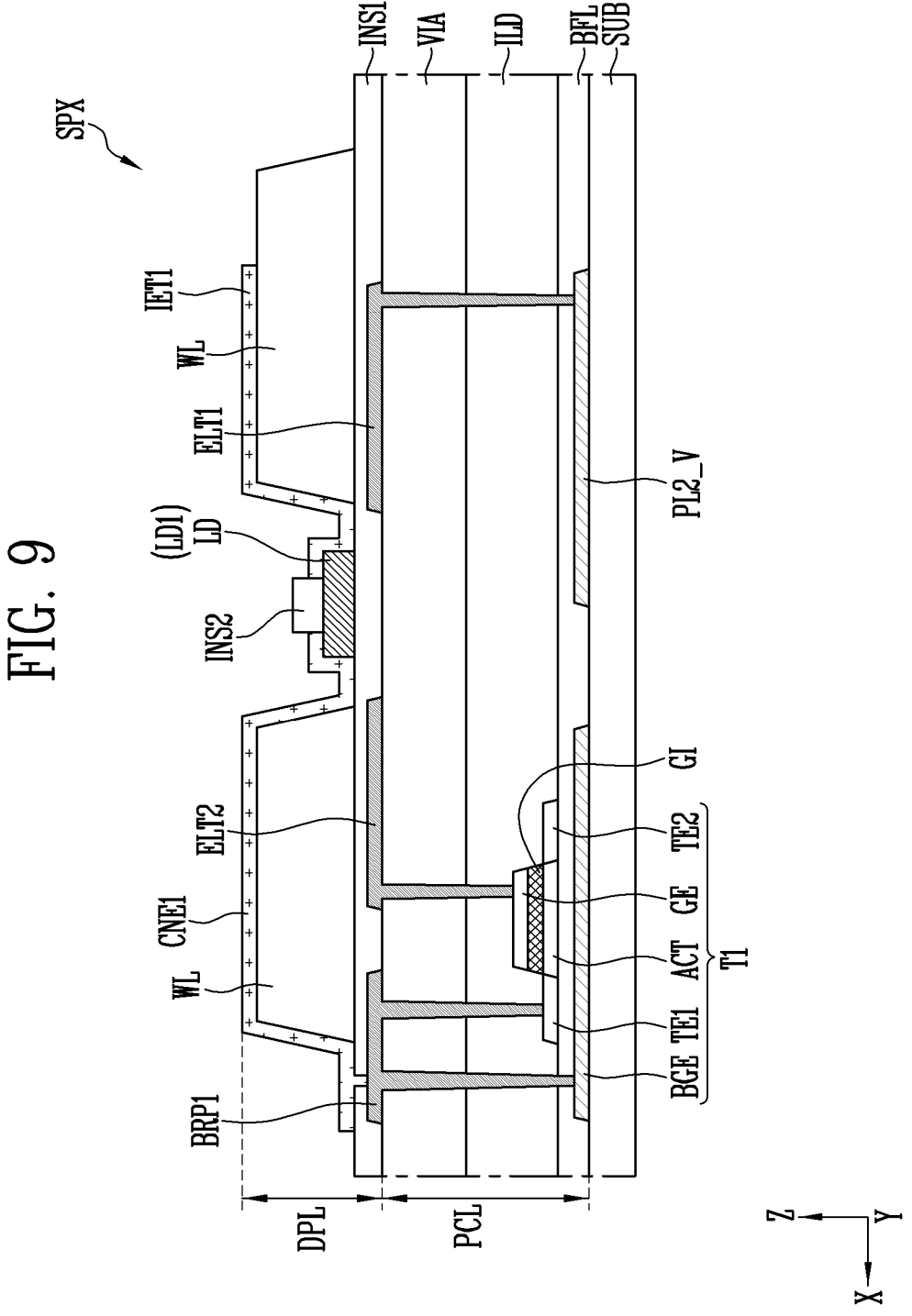
FIG. 9 is a schematic cross-sectional view illustrating a sub-pixel according to an embodiment.

FIG. 9 is a schematic cross-sectional view illustrating a sub-pixel according to an embodiment. In FIG. 9, the sub-pixel SPX is shown based on the first light emitting element LD1.

Referring to FIG. 9, the sub-pixel SPX may include a pixel circuit layer PCL and a display element layer DPL disposed on a substrate SUB. For convenience of description, the pixel circuit layer PCL is first described, and the display element layer DPL is described.

The pixel circuit layer PCL may include a first conductive layer (or a first metal layer), a first transistor T1, and a second conductive layer (or a second metal layer).

The first conductive layer may be disposed on the substrate SUB and may include a back gate electrode BGE and the second vertical power line PL2_V. The first conductive layer may form a single layer with a material selected from a group consisting of copper (Cu), molybdenum (Mo), tungsten (W), aluminum neodymium (AlNd), titanium (Ti), aluminum (Al), silver (Ag), and an alloy thereof alone or in combination, or may be formed in a double layer or multiple layer structure of molybdenum (Mo), titanium (Ti), copper (Cu), aluminum (Al), or silver (Ag) which is a low-resistance material to reduce a line resistance.

A buffer layer BFL may be provided and/or formed on the substrate SUB and the first conductive layer, and may prevent an impurity from diffusing into the first transistor T1. The buffer layer BFL may be an inorganic insulating layer including an inorganic material. The buffer layer BFL may include at least one of silicon nitride ($SiN_x$), silicon oxide ($SiO_x$), silicon oxynitride ($SiO_xN_y$), and aluminum oxide ($AlO_x$). The buffer layer BFL may be provided as a single layer, but may be provided as multiple layers of at least double or more layers. In case that the buffer layer BFL is provided as the multiple layers, each layer may be formed of a same material or a similar material or different materials. The buffer layer BFL may be omitted according to a material, a process condition, and the like of the substrate SUB.

A semiconductor pattern ACT of the first transistor T1 may be provided and/or formed on the buffer layer BFL. The semiconductor pattern ACT may include a first contact region (or a first transistor electrode TE1), a second contact region (or a second transistor electrode TE2), and a channel region between the first and second contact regions. The first contact region (or the first transistor electrode TE1) may contact a first bridge electrode BRP1. The channel region may overlap a gate electrode GE of the first transistor T1. The semiconductor pattern ACT may be a semiconductor pattern formed of amorphous silicon, poly silicon, low temperature poly silicon, an oxide semiconductor, or an organic semiconductor. The channel region is, for example, a semiconductor pattern that is not doped with an impurity, and may be an intrinsic semiconductor. The first contact region and the second contact region may be semiconductor patterns doped with impurities.

A gate insulating layer GI may be disposed on the semiconductor pattern ACT. The gate insulating layer GI may be an inorganic insulating layer including an inorganic material. For example, the gate insulating layer GI may include at least one of silicon nitride ($SiN_x$), silicon oxide ($SiO_x$), silicon oxynitride ($SiO_xN_y$), and aluminum oxide ($AlO_x$). However, a material of the gate insulating layer GI is not limited to the above-described embodiments, and according to an embodiment, various materials giving insulation to the gate insulating layer GI may be applied. For example, the gate insulating layer GI may be formed of an organic insulating layer including an organic material. The gate insulating layer GI may be provided as a single layer, but may also be provided as multiple layers of at least double or more layers.

The second conductive layer may be disposed on the gate insulating layer GI and may include the gate electrode GE of the first transistor T1. The gate electrode GE may overlap the channel region of the semiconductor pattern ACT. The second conductive layer may include a same material or a similar material as the first conductive layer, or may include one or more materials selected from the materials as the configuration material of the first conductive layer.

The interlayer insulating layer ILD may be disposed on the second conductive layer. The interlayer insulating layer ILD may be provided in a form including an organic insulating layer, an inorganic insulating layer, or an organic insulating layer disposed on an inorganic insulating layer. The inorganic insulating layer may include, for example, at least one of silicon oxide ($SiO_x$), silicon nitride ($SiN_x$), silicon oxynitride ($SiO_xN_y$), and aluminum oxide ($AlO_x$). The organic insulating layer may include, for example, at least one of polyacrylates resin, epoxy resin, phenolic resin, polyamides resin, polyimide resin, unsaturated polyesters resin, polyphenylene ethers resin, polyphenylene sulfides resin, and benzocyclobutene resin.

A via layer VIA may be disposed on the interlayer insulating layer ILD. The via layer VIA may be formed of an organic insulating layer. For example, the via layer VIA may include at least one of polyacrylates resin, epoxy resin, phenolic resin, polyamides resin, polyimide resin, unsaturated polyesters resin, polyphenylene ethers resin, polyphenylene sulfides resin, and benzocyclobutene resin, but is not limited thereto.

The display element layer DPL may be provided on the via layer VIA.

The display element layer DPL may include the first and second alignment electrodes ELT1 and ELT2, the first bridge electrode BRP1, a first insulating layer INS1, the bank patterns WL, the first light emitting element LD1 (or the light emitting element LD), the first electrode CNE1, and the first intermediate electrode IET1.

The first and second alignment electrodes ELT1 and ELT2 may be provided and/or formed on the via layer VIA.

The first and second alignment electrodes ELT1 and ELT2 may be formed of a material having a constant reflectance to allow light emitted from the light emitting element LD to proceed in an image display direction of the display device. The first and second alignment electrodes ELT1 and ELT2 may be formed of a conductive material having a constant reflectance. For example, the first and second alignment electrodes ELT1 and ELT2 may include a metal such as silver (Ag), magnesium (Mg), aluminum (Al), platinum (Pt), palladium (Pd), gold (Au), nickel (Ni), neodymium (Nd), iridium (Jr), chromium (Cr), titanium (Ti), and an alloy thereof as an opaque metal. According to an embodiment, the first and second alignment electrodes ELT1 and ELT2 may include a transparent conductive material. The transparent conductive material may include a conductive oxide such as indium tin oxide (ITO), indium zinc oxide (IZO), zinc oxide ($ZnO_x$), indium gallium zinc oxide (IGZO), indium tin zinc oxide (ITZO), a conductive polymer such as poly(3,4-ethylenedioxythiophene) (PEDOT), and the like within the spirit and the scope of the disclosure.

In case that the first and second alignment electrodes ELT1 and ELT2 include a transparent conductive material, a separate conductive layer formed of an opaque metal for reflecting the light emitted from the light emitting element LD in the image display direction of the display device may be added. However, a material of the first and second alignment electrodes ELT1 and ELT2 is not limited to the above-described materials.

The first and second alignment electrodes ELT1 and ELT2 may be provided and/or formed as a single layer, but are not limited thereto. According to an embodiment, the first and second alignment electrodes ELT1 and ELT2 may be provided and/or formed as multiple layers in which at least two materials among metals, alloys, conductive oxides, and conductive polymers may be stacked each other. The first and second alignment electrodes ELT1 and ELT2 may be formed as multiple layers of at least double or more layers to minimize distortion due to signal delay in case that transferring a signal (or a voltage) to the light emitting element LD. For example, the first and second alignment electrodes ELT1 and ELT2 may be formed as multiple layers sequentially stacked each other in an order of indium tin oxide (ITO)/silver (Ag)/indium tin oxide (ITO).

The first alignment electrode ELT1 may be electrically connected to the second conductive layer (or the gate electrode GE) through a contact hole passing through the via layer VIA and the interlayer insulating layer ILD. The second alignment electrode ELT2 may be electrically connected to the first conductive layer (or the second vertical power line PL2_V) through a contact hole passing through the via layer VIA and the interlayer insulating layer ILD.

The first bridge electrode BRP1 may be electrically connected to the first transistor T1 through a contact hole passing through the via layer VIA and the interlayer insulating layer ILD. For example, the first bridge electrode BRP1 may be electrically connected to the back gate electrode BGE through a first contact hole passing through the via layer VIA and the interlayer insulating layer ILD, and may be electrically connected to the semiconductor pattern ACT (or the first transistor electrode TE1) through a second contact hole passing through the via layer VIA and the interlayer insulating layer ILD.

The first bridge electrode BRP1 may include a same material or a similar material as the first and second alignment electrodes ELT1 and ELT2, and may be disposed on a same layer through a same process as the first and second alignment electrodes ELT1 and ELT2.

The first insulating layer INS1 may be provided and/or formed on the first and second alignment electrodes ELT1 and ELT2 and the first bridge electrode BRP1. The first insulating layer INS1 may include an inorganic insulating layer formed of an inorganic material or an organic insulating layer formed of an organic material. The first insulating layer INS1 may be formed of an inorganic insulating layer advantageous for protecting the light emitting element LD from the pixel circuit layer PCL. For example, the first insulating layer INS1 may include at least one of silicon nitride ($SiN_x$), silicon oxide ($SiO_x$), silicon oxynitride (Si- $O_xN_y$), and aluminum oxide ($AlO_x$), but is not limited thereto. According to an embodiment, the first insulating layer INS1 may be formed of an organic insulating layer advantageous for planarizing a support surface of the light emitting element LD.

The bank patterns WL may be provided and/or formed on the first insulating layer INS1. The bank patterns WL may be spaced apart from each other. FIG. 9 illustrates a case in which the bank patterns WL are disposed on the first insulating layer INS1, but a position of the bank patterns WL may be variously changed. For example, the bank patterns WL may be disposed between the via layer VIA and the first and second alignment electrodes ELT1 and ELT2.

The bank patterns WL may be an inorganic insulating layer including an inorganic material or an organic insulating layer including an organic material. According to an embodiment, the bank patterns WL may include a single layer of organic insulating layer and/or a single layer of inorganic insulating layer, but the disclosure is not limited thereto. According to an embodiment, the bank patterns WL may be provided in a form of multiple layers in which at least one organic insulating layer and at least one inorganic insulating layer may be stacked each other. However, a material of the bank patterns WL is not limited to the above-described embodiments, and according to an embodiment, the bank patterns WL may include a conductive material.

The bank patterns WL may have a cross-section of a trapezoidal shape in which a width becomes narrower toward an upper portion in a third direction (Z-axis direction), but are not limited thereto. According to an embodiment, the bank patterns WL may include a curved surface having a cross-section of a semi-elliptical shape, a semi-circular shape (or a semi-spherical shape), or the like in which a width becomes narrower toward an upper portion. In case that viewed in a cross-section, a shape of the bank patterns WL is not limited to the above-described embodiments and may be variously changed within a range capable of improving efficiency of the light emitted from each of the light emitting elements LD. The bank patterns WL may have a same height (or thickness) in the third direction (Z-axis direction).

The first light emitting element LD1 (or the light emitting element LD) may be aligned between the first and second alignment electrodes ELT1 and ELT2. The light emitting element LD may be disposed on the first insulating layer INS1 between the bank patterns WL.

The light emitting element LD may be a light emitting diode of an ultra-small size, for example, a size as small as a nano-scale to a micro-scale, using a material of an inorganic crystal structure. A detailed description of the light emitting element LD is described later with reference to FIGS. 12 and 13.

The number of light emitting elements LD provided in the sub-pixel SPX may be at least two to several tens. According to an embodiment, the number of light emitting elements LD provided in the sub-pixel SPX may be variously changed.

The light emitting element LD may emit any one of color light and/or white light. In an embodiment, the light emitting element LD may emit blue light of a short wavelength band, but is not limited thereto.

A second insulating layer INS2 (or a second insulating pattern) may be provided and/or formed on the light emitting element LD. The second insulating layer INS2 may be provided and/or formed on the light emitting element LD to partially cover an outer circumferential surface (or a surface) of the light emitting element LD. The active layer of the light emitting element LD may not be in contact with an external conductive material by the second insulating layer INS2. The second insulating layer INS2 may cover only a portion of the outer peripheral surface (or the surface) of the light emitting element LD to expose both ends of the light emitting element LD to the outside.

The second insulating layer INS2 may be a single layer or multiple layers, and may include an inorganic insulating layer including at least one inorganic material or an organic insulating layer including at least one organic material. According to a design condition or the like of the display device to which the light emitting element LD is applied, the second insulating layer INS2 may be formed of an inorganic insulating layer including an inorganic material or an organic insulating layer including an organic material. The light emitting element LD may be prevented from being separated from an aligned position, by forming the second insulating layer INS2 on the light emitting element LD after alignment of the light emitting element LD is completed.

The first electrode CNE1 may be provided on the first alignment electrode ELT1. The first electrode CNE1 may be provided and/or formed on the first end of the first light emitting element LD1 and may be electrically connected to the first end of the first light emitting element LD1.

The first electrode CNE1 may be provided on the first bridge electrode BRP1 and may be electrically connected to the first bridge electrode BRP1 through a contact hole passing through the first insulating layer INS1. Accordingly, the first electrode CNE1 may be electrically connected to the pixel circuit layer PCL (or the first transistor T1) through the first bridge electrode BRP1.

According to an embodiment, in case that an opening exposing the first alignment electrode ELT1 is formed in the first insulating layer INS1, the first electrode CNE1 may be in contact with the first alignment electrode ELT1 through the opening to be electrically connected to the first alignment electrode ELT1.

The first intermediate electrode IET1 may be provided on the second alignment electrode ELT2. The first intermediate electrode IET1 may be provided and/or formed on the second end of the first light emitting element LD1 and may be electrically connected to the second end of the first light emitting element LD1.

In order to allow the light emitted from the light emitting element LD to progress in the image display direction of the display device, the first electrode CNE1 and the first intermediate electrode IET1 may be formed of various transparent conductive materials. The first electrode CNE1 and the first intermediate electrode IET1 may be transparent or translucent to satisfy light transmittance (or transmittance). For example, the first electrode CNE1 and the first intermediate electrode IET1 may be transparently formed to have a transmittance of about 80% or more, or a transmittance of about 90% or more.

The first electrode CNE1 and the first intermediate electrode IET1 may be spaced apart from each other. For example, the first electrode CNE1 and the first intermediate electrode IET1 may be spaced apart from each other with the second insulating layer INS2 interposed therebetween. The first electrode CNE1 and the first intermediate electrode IET1 may be formed on a same layer through a same process, but are not limited thereto. For example, the first electrode CNE1 and the first intermediate electrode IET1 may be provided on different layers and formed through different processes.

According to an embodiment, the display element layer DPL may further include an optical layer. For example, the display element layer DPL may further include a color conversion layer including color conversion particles that convert the light emitted from the light emitting elements LD into light of a specific or given color. The display element layer DPL may further include a color filter layer that transmits only light of a specific wavelength band.

Figure 10:
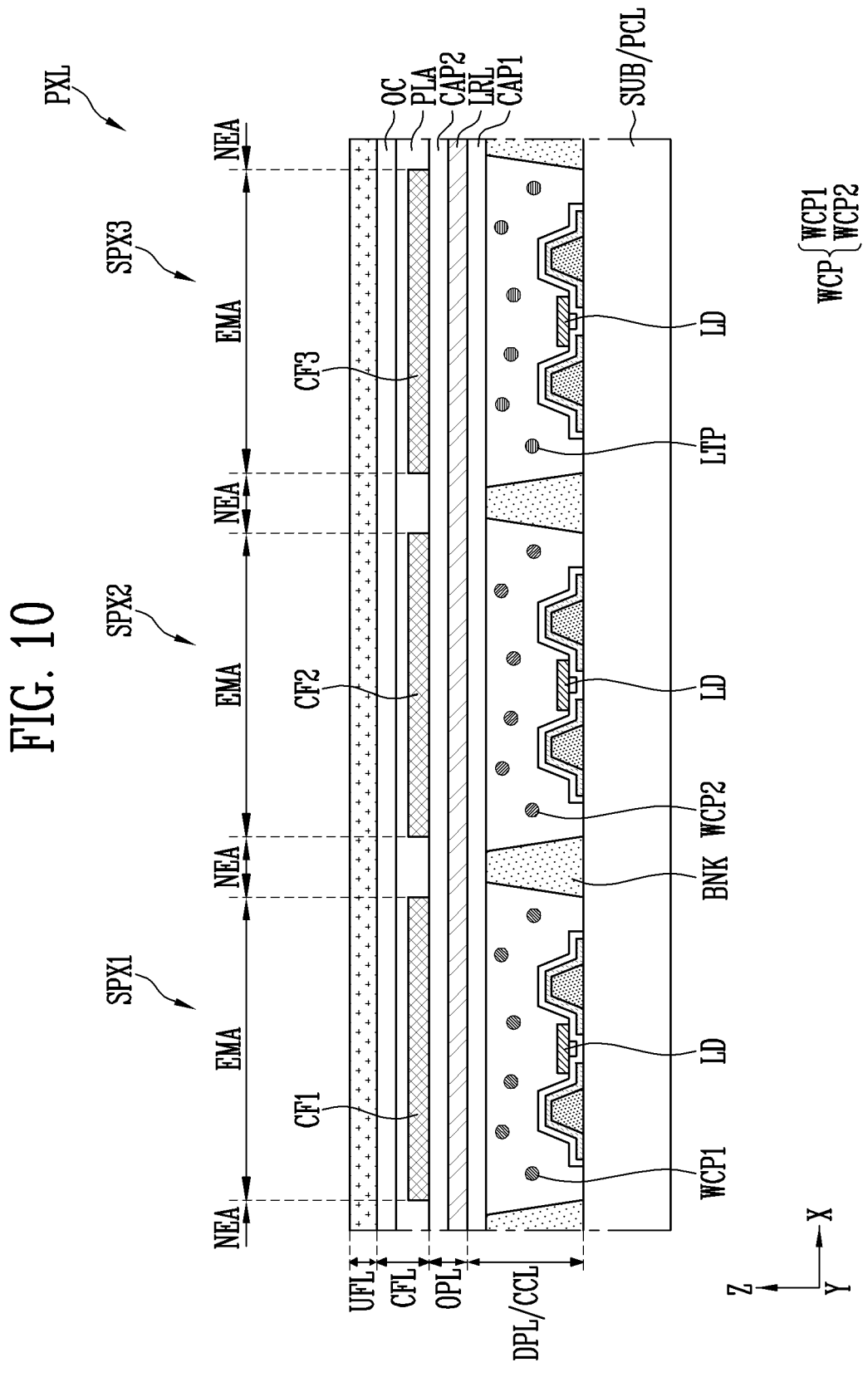
FIGS. 10 and 11 are schematic cross-sectional views illustrating a pixel according to an embodiment.
Figure 11:
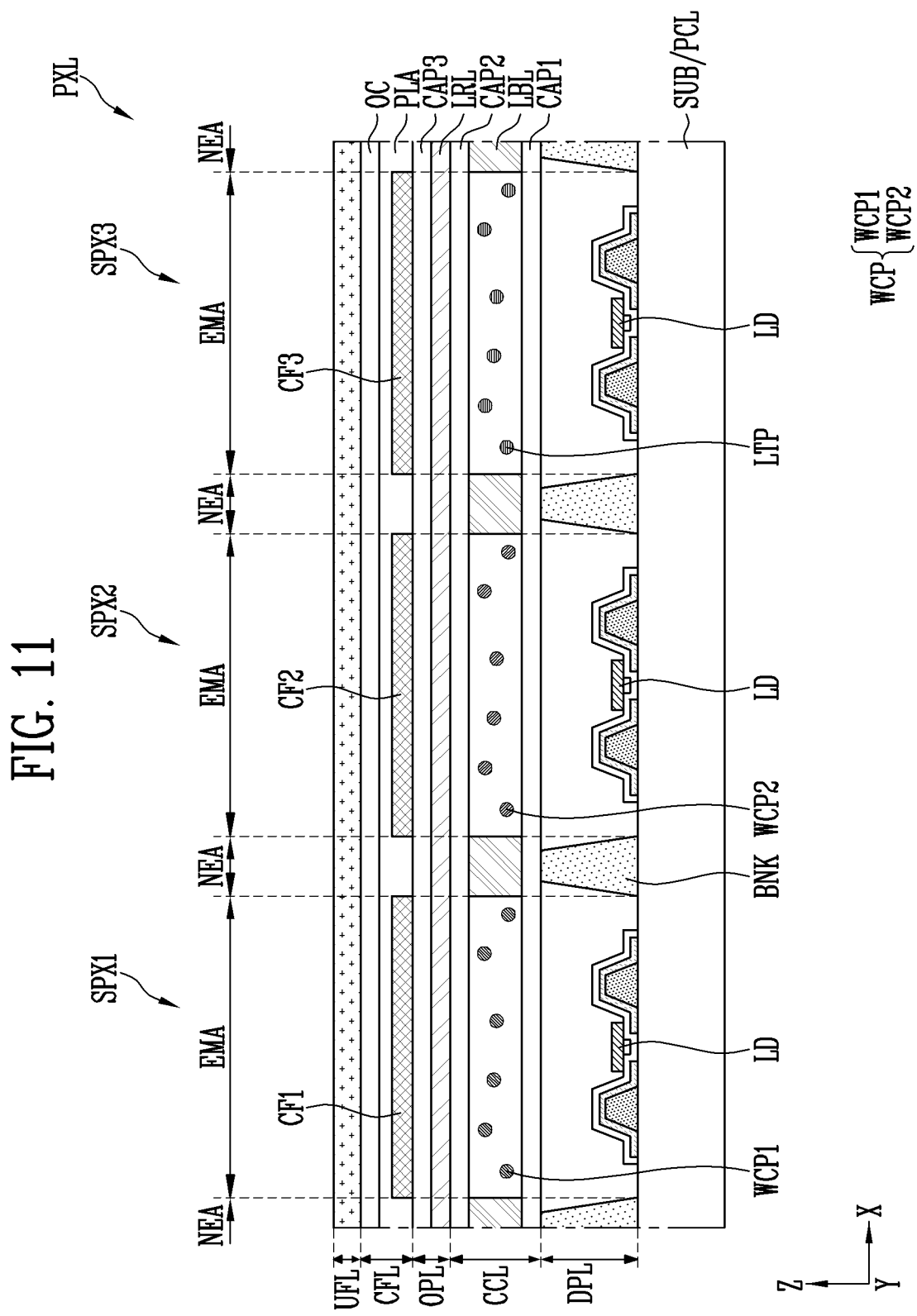

FIGS. 10 and 11 are schematic cross-sectional views illustrating a pixel according to an embodiment. For convenience of description, individual configurations of the pixel circuit layer PCL and the display element layer DPL are briefly expressed in FIGS. 10 and 11.

Referring to FIG. 10, the light emitting element LD disposed in each of the sub-pixels SPX1, SPX2, and SPX3 may emit light of a same color. For example, the sub-pixels SPX1, SPX2, and SPX3 may include a light emitting element LD that emits light of a third color, for example, blue light. A color conversion layer CCL and/or a color filter layer CFL may be provided in the sub-pixels SPX1, SPX2, and SPX3 to display a full-color of image. However, the disclosure is not limited thereto, and the sub-pixels SPX1, SPX2, and SPX3 may include light emitting elements LD that emit light of different colors.

As shown in FIG. 10, the color conversion layer CCL may be disposed on a same layer as the display element layer DPL. For example, the color conversion layer CCL may be disposed between banks BNK.

The bank BNK may be positioned in the non-emission area NEA of the sub-pixels SPX1, SPX2, and SPX3. The bank BNK may be formed between the sub-pixels SPX1, SPX2, and SPX3 to surround each emission area EMA. The bank BNK may include an opening overlapping the emission area EMA of each of the sub-pixels SPX1, SPX2, and SPX3. The bank BNK may function as a dam structure that prevents a solution for forming the color conversion layer CCL from flowing into the emission area EMA of the adjacent sub-pixels SPX1, SPX2, and SPX3, or that controls a constant amount of solution to be supplied to each emission area EMA.

The bank BNK may include an organic material or an inorganic material, and according to an embodiment, the bank BNK may include a black matrix material (or a light blocking material).

The color conversion layer CCL may include a first color conversion layer WCP1, a second color conversion layer WCP2, a light transmission layer LTP, and a first capping layer CAP1. WCP1 and WCP2 may be referred to collectively as a color conversion layer, WCP.

The first color conversion layer WCP1 may be disposed to overlap the emission area EMA of the first sub-pixel SPX1. The second color conversion layer WCP2 may be disposed to overlap the emission area EMA of the second sub-pixel SPX2. The light transmission layer LTP may be disposed to overlap the emission area EMA of the third sub-pixel SPX3. Each of the first color conversion layer WCP1, the second color conversion layer WCP2, and the light transmission layer LTP may be provided in the opening of the bank BNK overlapping the first to third sub-pixels SPX1, SPX2 and SPX3.

In an embodiment, the first color conversion layer WCP1 may include first color conversion particles that convert the light of the third color emitted from the light emitting element LD into the light of the first color. For example, in case that the light emitting element LD is a blue light emitting element emitting blue light and the first sub-pixel SPX1 is a red pixel, the first color conversion layer WCP1 may include a first quantum dot that converts the blue light emitted from the blue light emitting element into red light.

For example, the first color conversion layer WCP1 may include first quantum dots dispersed in a matrix material such as a base resin. The first quantum dot may absorb the blue light and shift a wavelength according to an energy transition to emit the red light. In case that the first sub-pixel SPX1 is a pixel of another color, the first color conversion layer WCP1 may include a first quantum dot corresponding to a color of the first sub-pixel SPX1.

In an embodiment, the second color conversion layer WCP2 may include second color conversion particles that convert the light of the third color emitted from the light emitting element LD into the light of the second color. For example, in case that the light emitting element LD is a blue light emitting element emitting blue light and the second sub pixel SPX2 is a green pixel, the second color conversion layer WCP2 may include a second quantum dot that converts the blue light emitted from the blue light emitting element into green light.

For example, the second color conversion layer WCP2 may include second quantum dots dispersed in a matrix material such as a base resin. The second quantum dot may absorb the blue light and shift a wavelength according to an energy transition to emit the green light.

The first quantum dot and the second quantum dot may have a shape of a spherical, pyramidal, multi-arm, or cubic nano particle, nano tube, nano wire, nano fiber, nano plate particle, or the like, but are not limited thereto, and a shape of the first quantum dot and the second quantum dot may be variously changed.

In an embodiment, an absorption coefficient of the first quantum dot and the second quantum dot may be increased by causing blue light having a relatively short wavelength in a visible light region to be incident on the first quantum dot and the second quantum dot. Accordingly, finally, efficiency of light emitted from the first sub-pixel SPX1 and the second sub-pixel SPX2 may be increased, and excellent color reproducibility may be secured. Manufacturing efficiency of the display device may be increased by configuring the sub-pixel SPX by using the light emitting element LD of a same color (for example, the blue light emitting element).

In an embodiment, the light transmission layer LTP may be provided to efficiently use the light of the third color emitted from the light emitting element LD. For example, in case that the light emitting element LD is a blue light emitting element emitting blue light and the third sub-pixel SPX3 is a blue pixel, the light transmission layer LTP may include at least one type of light scattering particles to efficiently use the light emitted from the light emitting element LD.

For example, the light transmission layer LTP may include light scattering particles dispersed in a matrix material such as a base resin. For example, the light transmission layer LTP may include light scattering particles such as silica, but a configuration material of the light scattering particles is not limited thereto. According to an embodiment, the light scattering particles may also be included in the first color conversion layer WCP1 and/or the second color conversion layer WCP2.

A first capping layer CAP1 may seal (or cover) the first color conversion layer WCP1, the second color conversion layer WCP2, and the light transmission layer LTP. The first capping layer CAP1 may be disposed between a low refraction layer LRL and the display element layer DPL. The first capping layer CAP1 may be provided over the sub-pixels SPX1, SPX2, and SPX3. The first capping layer CAP1 may prevent an impurity such as moisture or air from permeating from the outside and damaging or contaminating the color conversion layer CCL.

In an embodiment, the first capping layer CAP1 may be a single layer or multiple layers by including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$), but is not limited thereto.

An optical layer OPL may include the low refraction layer LRL and a second capping layer CAP2. The optical layer OPL may be disposed on the color conversion layer CCL. The optical layer OPL may be disposed on the display element layer DPL.

The low refraction layer LRL may be disposed between the color conversion layer CCL and the color filter layer CFL. The low refraction layer LRL may be disposed between the first capping layer CAP1 and the second capping layer CAP2. The low refraction layer LRL may be provided over the sub-pixels SPX1, SPX2, and SPX3.

The low refraction layer LRL may serve to improve light efficiency by recycling light provided from the color conversion layer CCL by total reflection. To this end, the low refraction layer LRL may have a refractive index relatively lower than that of the color conversion layer CCL.

In an embodiment, the low refraction layer LRL may include a base resin and a hollow particle dispersed in the base resin. The hollow particle may include a hollow silica particle. By way of example, the hollow particle may be a pore formed by porogen, but is not limited thereto. The low refraction layer LRL may include at least one of a zinc oxide (ZnO) particle, a titanium dioxide ($TiO_2$) particle, and a nano silicate particle, but is not limited thereto.

The second capping layer CAP2 may be disposed on the low refraction layer LRL. The second capping layer CAP2 may be disposed between the color filter layer CFL and the low refraction layer LRL. The second capping layer CAP2 may be provided over the sub-pixels SPX1, SPX2, and SPX3. The second capping layer CAP2 may prevent an impurity such as moisture or air from permeating from the outside and damaging or contaminating the low refraction layer LRL. The second capping layer CAP2 may include a same material or a similar material as the first capping layer CPA1, or may include one or more materials selected from the materials as the configuration material of the first capping layer CPA1. For example, the second capping layer CAP2 may be a single layer or multiple layers by including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$), but is not limited thereto.

The color filter layer CFL may be disposed on the second capping layer CAP2. The color filter layer CFL may be provided over the sub-pixels SPX1, SPX2, and SPX3. The color filter layer CFL may include color filters CF1, CF2, and CF3, a planarization layer PLA, and an overcoat layer OC.

In an embodiment, the color filters CF1, CF2, and CF3 may be disposed on the second capping layer CAP2. The color filters CF1, CF2, and CF3 may overlap the emission area EMA of the first to third sub-pixels SPX1, SPX2, and SPX3, respectively.

A first color filter CF1 may transmit the light of the first color, and may not transmit the light of the second color and the light of the third color. A second color filter CF2 may transmit the light of the second color, and may not transmit the light of the first color and the light of the third color. A third color filter CF3 may transmit the light of the third color, and may not transmit the light of the first color and the light of the second color.

In an embodiment, the planarization layer PLA may be disposed on the color filters CF1, CF2, and CF3. The planarization layer PLA may cover the color filters CF1, CF2, and CF3. The planarization layer PLA may planarize a step difference generated due to the color filters CF1, CF2, and CF3. The planarization layer PLA may be provided over the sub-pixels SPX1, SPX2, and SPX3.

The planarization layer PLA may include an organic material such as acrylates resin, epoxy resin, phenolic resin, polyamides resin, polyimides resin, polyester resin, polyphenylenesulfides resin, or benzocyclobutene (BCB). However, the disclosure is not limited thereto, and the planarization layer PLA may include various types of inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The overcoat layer OC may be disposed on the planarization layer PLA. The overcoat layer OC may be disposed between an upper film layer UFL and the planarization layer PLA. The overcoat layer OC may be provided over the sub-pixels SPX1, SPX2, and SPX3. The overcoat layer OC may cover a lower member including the color filter layer CFL. The overcoat layer OC may prevent moisture or air from permeating into the above-described lower member. The overcoat layer OC may protect the above-described lower member from a foreign substance such as dust.

The overcoat layer OC may include an organic material or an inorganic material. For example, the overcoat layer OC may include one or more materials selected from the materials as the configuration material of the planarization layer PLA.

The upper film layer UFL may be disposed on the color filter layer CFL. The upper film layer UFL may be disposed outside the display device to reduce external influence on the display device. The upper film layer UFL may be provided over the sub-pixels SPX1, SPX2, and SPX3.

In an embodiment, the upper film layer UFL may include an AR coating layer (anti-reflective coating). The AR coating layer may refer to a configuration in which a material having an anti-reflection function is applied to one surface or a surface of a specific or given configuration. Here, the applied material may have a low reflectance. For example, the material used for the AR coating layer may include any one of silicon oxide ($SiO_x$), aluminum oxide ($AlO_x$), and titanium oxide ($TiO_x$), but is not limited thereto.

In an embodiment, the color conversion layer CCL may be disposed on the display element layer DPL as shown in FIG. 11. For example, the first capping layer CAP1 may seal (or cover) an area in which the light emitting elements LD are disposed, and the color conversion layer CCL may be disposed on the first capping layer CAP1.

In an embodiment, the color conversion layer CCL may further include a light blocking layer LBL (or a light blocking pattern). The light blocking layer LBL may be disposed on the display element layer DPL. The light blocking layer LBL may be disposed between the first capping layer CAP1 and the second capping layer CAP2. The light blocking layer LBL may be disposed to surround the first color conversion layer WCP1, the second color conversion layer WCP2, and the light transmission layer LTP at a boundary between the sub-pixels SPX1, SPX2, and SPX3.

The light blocking layer LBL may overlap the non-emission area NEA. The light blocking layer LBL may surround the emission area EMA of the sub-pixels SPX1, SPX2, and SPX3. The light blocking layer LBL may be formed of an organic material including at least any one of graphite, carbon black, black pigment, or black dye, or may be formed of a metal material including chromium (Cr), but is not limited as long as the light blocking layer LBL is a material capable of blocking and absorbing light.

The second capping layer CAP2 may seal (or cover) the first color conversion layer WCP1, the second color conversion layer WCP2, and the light transmission layer LTP.

The low refraction layer LRL may be disposed between the second capping layer CAP2 and a third capping layer CAP3. The third capping layer CAP3 may include a same material or a similar material as the first capping layer CPA1 or may include one or more materials selected from the materials as the configuration material of the first capping layer CPA1.

Figure 12:
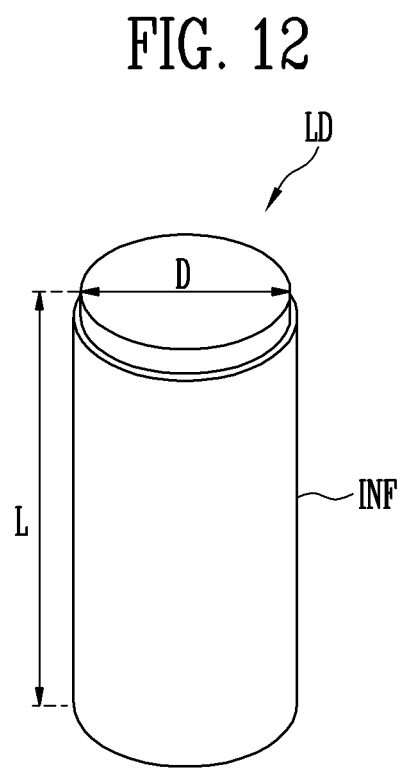
Figure 13:
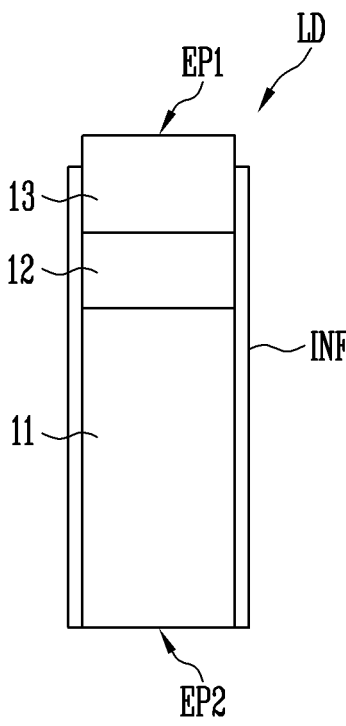
FIG. 13 is a schematic cross-sectional view illustrating a light emitting element according to an embodiment.

FIG. 12 is a schematic perspective view illustrating a light emitting element according to an embodiment. FIG. 13 is a schematic cross-sectional view illustrating a light emitting element according to an embodiment. FIGS. 12 and 13 show a column shape of light emitting element LD, but a type and/or a shape of the light emitting element LD are/is not limited thereto.

Referring to FIGS. 12 and 13, the light emitting element LD may include a first semiconductor layer 11, a second semiconductor layer 13, and an active layer 12 interposed between the first and second semiconductor layers 11 and 13. For example, in case that an extension direction of the light emitting element LD is a length L direction, the light emitting element LD may include the first semiconductor layer 11, the active layer 12, and the second semiconductor layer 13 sequentially stacked each other along the length L direction.

The light emitting element LD may be provided in a column shape extending along one direction or a direction. The light emitting element LD may have a first end EP1 and a second end EP2. One of the first and second semiconductor layers 11 and 13 may be disposed at the first end EP1 of the light emitting element LD. The other of the first and second semiconductor layers 11 and 13 may be disposed at the second end EP2 of the light emitting element LD.

According to an embodiment, the light emitting element LD may be a light emitting element manufactured in a column shape through an etching method or the like within the spirit and the scope of the disclosure. In the specification, the column shape may include a rod-like shape or a bar-like shape that is long in the length L direction (for example, an aspect ratio is greater than 1), such as a circular column or a polygonal column, and a shape of a cross-section thereof is not particularly limited. For example, a length L of the light emitting element LD may be greater than a diameter D (or a width of a cross section).

The light emitting element LD may have a size as small as a nanometer scale to a micrometer scale. For example, each light emitting element LD may have the diameter D (or width) and/or the length L of a nanometer scale to micrometer scale range. However, a size of the light emitting element LD is not limited thereto, and the size of the light emitting element LD may be variously changed according to a design condition of various devices using a light emitting device using the light emitting element LD as a light source, for example, a display device.

The first semiconductor layer 11 may be a semiconductor layer of a first conductivity type. For example, the first semiconductor layer 11 may include an n-type semiconductor layer. For example, the first semiconductor layer 11 may include any one semiconductor material among InAlGaN, GaN, AlGaN, InGaN, AlN, and InN, and may include an n-type semiconductor layer doped with a first conductivity type dopant such as Si, Ge, and Sn. However, a material configuring the first semiconductor layer 11 is not limited thereto, and various other materials may form the first semiconductor layer 11.

The active layer 12 may be disposed on the first semiconductor layer 11 and may be formed in a single quantum well or multi-quantum well structure. A position of the active layer 12 may be variously changed according to the type of the light emitting element LD.

A clad layer (not shown) doped with a conductive dopant may be formed on and/or under or below the active layer 12. For example, the clad layer may be formed of AlGaN or InAlGaN. According to an embodiment, a material of AlGaN, InAlGaN, or the like may be used to form the active layer 12, and various other materials may form the active layer 12.

The second semiconductor layer 13 may be disposed on the active layer 12 and may include a semiconductor layer of a type different from that of the first semiconductor layer 11. For example, the second semiconductor layer 13 may include a p-type semiconductor layer. For example, the second semiconductor layer 13 may include at least one semiconductor material among InAlGaN, GaN, AlGaN, InGaN, AlN, and InN, and may include a p-type semiconductor layer doped with a second conductivity type dopant such as Mg. However, a material configuring the second semiconductor layer 13 is not limited thereto, and various other materials may form the second semiconductor layer 13.

In case that a voltage equal to or greater than a threshold voltage is applied to both ends of the light emitting element LD, an electron-hole pair is combined in the active layer 12, and thus the light emitting element LD emits light. By controlling light emission of the light emitting element LD using such a principle, the light emitting element LD may be used as a light source of various light emitting devices including a pixel of a display device.

The light emitting element LD may further include an insulating film INF provided on a surface. The insulating film INF may be formed on the surface of the light emitting element LD to surround an outer circumferential surface of at least active layer 12, and may further surround one region of the first and second semiconductor layers 11 and 13.

According to an embodiment, the insulating film INF may expose the both ends of the light emitting element LD having different polarities. For example, the insulating film INF may expose one end or an end of each of the first and second semiconductor layers 11 and 13 positioned at the first and second ends EP1 and EP2 of the light emitting element LD. In an embodiment, the insulating film INF may expose a side portion of the first and second semiconductor layers 11 and 13 adjacent to the first and second ends EP1 and EP2 of the light emitting element LD having different polarities.

According to an embodiment, the insulating film INF may include at least one insulating material among silicon oxide ($SiO_x$), silicon nitride ($SiN_x$), silicon oxynitride ($SiO_xN_y$), aluminum oxide ($AlO_x$), and titanium oxide ($TiO_x$), and may be a single layer or multiple layers (for example, a double layer formed of aluminum oxide ($AlO_x$) and silicon oxide ($SiO_x$), but is not limited thereto. According to an embodiment, the insulating film INF may be omitted.

In case that the insulating film INF is provided to cover the surface of the light emitting element LD, by way of example, the outer circumferential surface of the active layer 12, a short between the active layer 12, and a first pixel electrode, a second pixel electrode, or the like to be described later may be prevented. Accordingly, electrical stability of the light emitting element LD may be secured.

In case that the insulating film INF is provided on the surface of the light emitting element LD, a surface defect of the light emitting element LD may be minimized, thereby improving life and efficiency. In a case where light emitting elements LD are disposed in close contact with each other, an unwanted short between the light emitting elements LD may be prevented.

In an embodiment, the light emitting element LD may further include an additional component in addition to the first semiconductor layer 11, the active layer 12, the second semiconductor layer 13, and/or the insulating film INF surrounding them. For example, the light emitting element LD may further include at least one phosphor layer, active layer, semiconductor layer, and/or electrode layer disposed on one end side or an end side of the first semiconductor layer 11, the active layer 12, and/or the second semiconductor layer 13. For example, a contact electrode layer may be disposed at each of the first and second ends EP1 and EP2 of the light emitting element LD.

A light emitting device including the light emitting element LD described above may be used in various types of devices that require a light source, including a display device. For example, the light emitting elements LD may be disposed in each sub-pixel SPX of the above-described display panel PNL, and the light emitting elements LD may be used as a light source of each sub-pixel SPX. However, an application field of the light emitting element LD is not limited to the above-described example. For example, the light emitting element LD may also be used in other types of devices that require a light source, such as a lighting device.

Although the disclosure has been described with reference to embodiments, those skilled in the art will understand that the disclosure may be variously modified and changed without departing from the spirit and scope of the disclosure and as described in the attached claims.

Therefore, the scope of the disclosure should not be limited to the contents described in the detailed description of the specification, and should also be defined by the claims.

What is claimed is:

1. A display device comprising:

a first pixel and a second pixel, each of the first pixel and the second pixel including a first sub-pixel, a second sub-pixel, and a third sub-pixel;

a first data line electrically connected to the first sub-pixel of the first pixel;

a second data line electrically connected to the first sub-pixel of the second pixel; and a first connection line electrically connecting the first data line and the second data line, wherein each of the first sub-pixel, the second sub-pixel, and the third sub-pixel comprises:

a first area disposed at a side of a pixel circuit;

a second area disposed on another side of the pixel circuit;

light emitting elements electrically connected to the pixel circuit; and an electrode electrically connecting the light emitting elements and the pixel circuit, the electrode of the first sub-pixel of the first pixel includes a first extension electrically connected to the pixel circuit in the first area and overlapping the second area in plan view, and the electrode of the first sub-pixel of the second pixel includes a second extension electrically connected to the pixel circuit in the second area and overlapping the first area in plan view.

2. The display device according to claim 1, wherein the first pixel and the second pixel are adjacent to each other in a same pixel row.

3. The display device according to claim 1, wherein the first sub-pixel, the second sub-pixel, and the third sub-pixel are sequentially disposed in a first direction.

4. The display device according to claim 3, wherein the first data line and the second data line are disposed in the first direction and extend in a second direction.

5. The display device according to claim 1, wherein the first data line is disposed between the first sub-pixel and the second sub-pixel of the first pixel, and the second data line is disposed between the first sub-pixel and the second sub-pixel of the second pixel.

6. The display device according to claim 1, wherein the electrode of the first sub-pixel of the first pixel and the electrode of the first sub-pixel of the second pixel have a same shape.

7. The display device according to claim 1, wherein the electrode of the first sub-pixel of the first pixel and the electrode of the first sub-pixel of the second pixel have a same area.

8. The display device according to claim 1, wherein the first sub-pixel emits light in a first color, the second sub-pixel emits light in a second color, and the third sub-pixel emits light in a third color.

9. The display device according to claim 1, wherein the light emitting elements comprise:

a first semiconductor layer;

a second semiconductor layer disposed on the first semiconductor layer; and an active layer disposed between the first semiconductor layer and the second semiconductor layer.

10. The display device according to claim 1, further comprising:

a third data line electrically connected to the second sub-pixel of the first pixel;

a fourth data line electrically connected to the second sub-pixel of the second pixel; and a second connection line electrically connecting the third data line and the fourth data line.

11. The display device according to claim 1, further comprising:

a fifth data line electrically connected to the third sub-pixel of the first pixel;

a sixth data line electrically connected to the third sub-pixel of the second pixel; and a third connection line electrically connecting the fifth data line and the sixth data line.

12. A display device comprising:

a first pixel and a second pixel, each of the first pixel and the second pixel including a sub-pixel emitting light in a same color;

a first data line electrically connected to the sub-pixel of the first pixel;

a second data line electrically connected to the sub-pixel of the second pixel; and a connection line electrically connecting the first data line and the second data line, wherein the sub-pixels comprise:

a first area disposed at a side of a pixel circuit;

a second area disposed on another side of the pixel circuit;

light emitting elements electrically connected to the pixel circuit; and an electrode electrically connecting the pixel circuit and the light emitting elements, the electrode of the sub-pixel of the first pixel includes a first extension electrically connected to the pixel circuit in the first area and overlapping the second area in plan view, and the electrode of the sub-pixel of the second pixel includes a second extension electrically connected to the pixel circuit in the second area and overlapping the first area in plan view.

13. The display device according to claim 12, wherein the first pixel and the second pixel are adjacent to each other in a first direction in a same pixel row.

14. The display device according to claim 13, wherein the first data line and the second data line are disposed in the first direction and extend in a second direction.

15. The display device according to claim 12, wherein the electrode of the sub-pixel of the first pixel and the electrode of the sub-pixel of the second pixel have a same shape.

16. The display device according to claim 12, wherein the electrode of the sub-pixel of the first pixel and the electrode of the sub-pixel of the second pixel have a same area.

17. The display device according to claim 12, wherein the light emitting elements comprise:

a first semiconductor layer;

a second semiconductor layer disposed on the first semiconductor layer; and an active layer disposed between the first semiconductor layer and the second semiconductor layer.

18. The display device according to claim 12, further comprising:

alignment electrodes spaced apart from each other, wherein the light emitting elements are disposed between the alignment electrodes.

19. The display device according to claim 18, further comprising:

a bridge electrode, the bridge electrode and the alignment electrodes being disposed on a same layer, wherein the electrode of the sub-pixels is electrically connected to the pixel circuit through the bridge electrode.

20. The display device according to claim 12, further comprising:

a color conversion layer disposed on the light emitting elements; and a color filter layer disposed on the color conversion layer.

* * * * *